United States Patent
Kim et al.

(10) Patent No.: US 12,482,425 B2
(45) Date of Patent: Nov. 25, 2025

(54) PIXEL CIRCUIT COMPRISING A PLURALITY OF LIGHT EMITTING ELEMENTS AND DISPLAY APPARATUS INCLUDING THE SAME

(71) Applicant: LG Display Co., Ltd., Seoul (KR)

(72) Inventors: Haksu Kim, Paju-si (KR); KwangHyun Baek, Paju-si (KR); SeongWook Choi, Paju-si (KR); SeongHo Cho, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/211,932

(22) Filed: Jun. 20, 2023

(65) Prior Publication Data

US 2024/0005873 A1    Jan. 4, 2024

(30) Foreign Application Priority Data

Jun. 30, 2022  (KR) .................. 10-2022-0080461

(51) Int. Cl.
  *G09G 3/3266*  (2016.01)
  *G09G 3/32*  (2016.01)
  (Continued)

(52) U.S. Cl.
  CPC .......... *G09G 3/3266* (2013.01); *G09G 3/32* (2013.01); *G09G 3/3233* (2013.01);
  (Continued)

(58) Field of Classification Search
  None
  See application file for complete search history.

(56) References Cited

U.S. PATENT DOCUMENTS

| 10,424,232 B2 * | 9/2019 | Schubert ............... G02B 26/06 |
| 2007/0171193 A1 | 7/2007 | Nakamura |

(Continued)

FOREIGN PATENT DOCUMENTS

| CN | 102456315 A | 5/2012 |
| CN | 113707080 A | 11/2021 |

(Continued)

OTHER PUBLICATIONS

Office Action dated Apr. 2, 2024, issued in corresponding Taiwanese Patent Application No. 112120925.

(Continued)

*Primary Examiner* — Matthew A Eason
(74) *Attorney, Agent, or Firm* — Morgan, Lewis & Bockius LLP

(57) ABSTRACT

A display apparatus may include a gate driving circuit configured to output a first light emission signal and a second light emission signal; a first pixel circuit including a first light emitting element configured to emit light based on the first light emission signal and a second light emitting element configured to emit light based on the second light emission signal; and a second pixel circuit including a third light emitting element configured to emit light based on the first light emission signal and a fourth light emitting element configured to emit light based on the second light emission signal. The display apparatus may further include a first lens disposed on each of the first light emitting element, the second light emitting element, and the third light emitting element, and at least one second lens different from the first lens and disposed on the fourth light emitting element.

22 Claims, 10 Drawing Sheets

(51) Int. Cl.
*G09G 3/3233* (2016.01)
*H10K 50/858* (2023.01)

(52) U.S. Cl.
CPC ... *H10K 50/858* (2023.02); *G09G 2300/0842* (2013.01); *G09G 2310/0267* (2013.01); *G09G 2380/10* (2013.01)

(56) References Cited

U.S. PATENT DOCUMENTS

| | | |
|---|---|---|
| 2009/0322215 A1 | 12/2009 | Sung et al. |
| 2011/0284881 A1 | 11/2011 | Shikina et al. |
| 2012/0098805 A1 | 4/2012 | Kubota et al. |
| 2012/0127064 A1 | 5/2012 | Kawano et al. |
| 2012/0133682 A1* | 5/2012 | Kawano ............... G09G 3/3233 345/690 |
| 2012/0133683 A1* | 5/2012 | Goden ............... G09G 3/3233 345/77 |
| 2016/0218325 A1 | 7/2016 | Choi et al. |
| 2017/0242161 A1* | 8/2017 | Zhang ............... G02B 3/0056 |
| 2017/0316736 A1* | 11/2017 | Hughes ............... H01L 25/0753 |
| 2018/0182284 A1 | 6/2018 | Chung |
| 2020/0043381 A1 | 2/2020 | Tsukamoto et al. |
| 2020/0358034 A1 | 11/2020 | Koshihara |
| 2020/0381484 A1 | 12/2020 | Choe |
| 2021/0407386 A1 | 12/2021 | Li et al. |
| 2022/0158134 A1* | 5/2022 | Hinata ............... G02B 3/0043 |
| 2022/0158135 A1* | 5/2022 | Irobe ............... H10K 50/852 |
| 2022/0319419 A1 | 10/2022 | Xiang et al. |
| 2022/0344445 A1 | 10/2022 | Tanaka |
| 2023/0343255 A1* | 10/2023 | Krener-Iversen ...... G02B 30/27 |

FOREIGN PATENT DOCUMENTS

| | | |
|---|---|---|
| CN | 114639794 A | 6/2022 |
| EP | 4099417 A1 | 12/2022 |
| JP | 2007-219486 A | 8/2007 |
| JP | 2007-245792 A | 9/2007 |
| JP | 2012-113934 A | 6/2012 |
| JP | 2020-184480 A | 11/2020 |
| JP | 2022-080507 A | 5/2022 |
| KR | 10-2021-0121933 A | 10/2021 |
| WO | 2011/145174 A1 | 11/2011 |
| WO | 2021/064930 A1 | 4/2021 |
| WO | 2022/061892 A1 | 3/2022 |

OTHER PUBLICATIONS

Search Report dated Nov. 3, 2023 for corresponding European Patent Application 23177558.6.
Office Action dated Feb. 13, 2024, issued in corresponding Japanese Patent Application No. 2023-102906.
Office Action dated Oct. 3, 2025 issued in corresponding Indian Patent Application No. 20231403433.

* cited by examiner

PIXEL CIRCUIT COMPRISING A PLURALITY OF LIGHT EMITTING ELEMENTS AND DISPLAY APPARATUS INCLUDING THE SAME

CROSS-REFERENCE TO RELATED APPLICATION

This application claims the benefit of and the priority to Korean Patent Application No. 10-2022-0080461, filed on Jun. 30, 2022, in the Republic of Korea. The entire contents of this prior Korean application being hereby expressly incorporated by reference into the present application.

BACKGROUND

Technical Field

The present disclosure relates to a pixel circuit comprising a plurality of light emitting elements and a display apparatus comprising the pixel circuit.

Discussion of the Related Art

With the advancement of technologies in the modern society, a display apparatus has been used in various forms to provide users with information. The display apparatus is also included in various electronic devices, which receive a user input and use advanced technologies to provide information to correspond to the received input, as well as an electronic display board that unilaterally transfers visual information.

For example, the display apparatus can be included in a vehicle to provide various kinds of information to a driver and a passenger of the vehicle. However, the display apparatus of the vehicle needs to properly display contents so as not to disturb driving of the vehicle. For example, the display apparatus needs to limit a display of contents which can potentially disrupt the driver's concentration on driving during the driving of the vehicle.

SUMMARY

The present disclosure is directed to a pixel circuit comprising a plurality of light emitting elements and a display apparatus comprising the same that substantially obviate one or more of the problems due to limitations and disadvantages of the related art.

An aspect of one or more embodiments of the present disclosure is to provide a display circuit that adjusts a viewing angle of a display in accordance with a mode based on a plurality of light emitting elements and lenses disposed on the plurality of light emitting elements, and a display apparatus comprising the pixel circuit.

Additional features and aspects of the present disclosure will be set forth in the description that follows and in part will become apparent from the description or may be learned by practice of the inventive concepts provided herein. Other features and aspects of the inventive concepts may be realized and attained by the structure particularly pointed out in, or derivable from, the written description, claims hereof, and the appended drawings.

To achieve these objects and other advantages of the present disclosure, as embodied and broadly described herein, a display apparatus may comprise: a gate driving circuit configured to output a first light emission signal and a second light emission signal; a first pixel circuit including a first light emitting element configured to emit light based on the first light emission signal and a second light emitting element configured to emit light based on the second light emission signal; a second pixel circuit including a third light emitting element configured to emit light based on one of the first and second light emission signals and a fourth light emitting element configured to emit light based on the other of the first and second light emission signals; a first lens disposed on each of the first light emitting element, the second light emitting element, and one of the third and fourth light emitting elements, the one of the third and fourth light emitting elements being configured to emit light based on the first light emission signal; and at least one second lens different from the first lens and disposed on the other of the third and fourth light emitting elements, the other of the third and fourth light emitting elements being configured to emit light based on the second light emission signal.

In another aspect of the present disclosure, a display panel may comprise: a first display area and a second display area adjacent to each other; a first pixel circuit disposed in the first display area and including a first light emitting element configured to emit light based on a first light emission signal from a gate driving circuit and a second light emitting element configured to emit light based on a second light emission signal from the gate driving circuit; a second pixel circuit disposed in the second display area and including a third light emitting element configured to emit light based on one of the first and second light emission signals; and a fourth light emitting element configured to emit light based on the other of the first and second light emission signals; a first lens disposed on the first light emitting element, the second light emitting element, and one of the third and fourth light emitting elements, the one of the third and fourth light emitting elements being configured to emit light based on the first light emission signal; and at least one second lens different from the first lens and disposed on the other of the third and fourth light emitting elements, the other of the third and fourth light emitting elements being configured to emit light based on the second light emission signal.

It is to be understood that both the foregoing general description and the following detailed description of the present disclosure are by way of example and are intended to provide further explanation of the disclosures as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principles of the disclosure. In the drawings.

DETAILED DESCRIPTION

Figure 1:
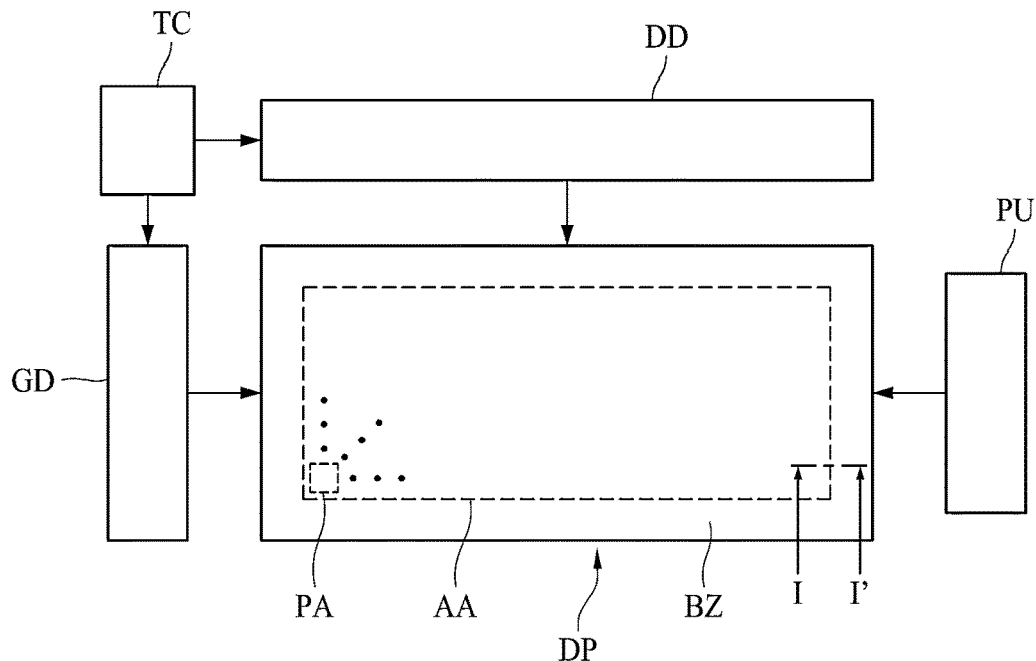
FIG. 1 is a functional block view illustrating a display apparatus according to an example embodiment of the present disclosure.

Reference will now be made in detail to embodiments of the present disclosure, examples of which may be illustrated in the accompanying drawings. Advantages and features of the present disclosure, and methods of achieving them will become apparent with reference to the example embodiments described below in detail in conjunction with the accompanying drawings.

Unless otherwise defined, the terms (including technical and scientific terms) used herein have the same meaning as commonly understood by one of ordinary skill in the art to which example embodiments belong. It should be further understood that terms, such as those defined in commonly used dictionaries, should be interpreted as having a meaning that is, for example, consistent with their meaning in the context of the relevant art and should not be interpreted in an idealized or overly formal sense, unless expressly defined otherwise herein.

Where a certain part of the entire disclosure is described to include a certain element, this does not mean to exclude other components. Unless otherwise stated, other components may be included.

The term "at least one" should be understood as including any and all combinations of one or more of the associated listed items. For example, the expression "at least one of A, B, and C" encompasses "A alone," "B alone," "C alone," "A and B," "A and C," "B and C," and "all of A, B, and C."

The shapes, dimensions, areas, lengths, thicknesses, ratios, angles, numbers, and the like, which are illustrated in the drawings to describe various example embodiments of the present disclosure, are merely given by way of example. Therefore, the present disclosure is not limited to such illustrated details in the drawings. Like reference numerals generally denote like elements throughout the specification, unless otherwise specified.

In the following description, where a detailed description of a relevant known function or configuration may unnecessarily obscure aspects of the present disclosure, a detailed description of such a known known function or configuration may be omitted or be briefly discussed.

Where a term like "comprise," "have," "include," "contain," "constitute," "made up of," or "formed of" is used, one or more other elements may be added unless a more limiting term, such as "only" or the like, is used. An element described in the singular form is intended to include a plurality of elements, and vice versa, unless the context clearly indicates otherwise.

In construing an element, the element should be construed as including an error or tolerance range even where no explicit description of such an error or tolerance range is provided.

Where a positional relationship between two elements is described, for example, as "on," "above," "below," "beneath," and "next," or the like, one or more other elements may be located between the two elements unless a more limiting term, such as "direct(ly)," is used. For example, where a first element is described as being positioned "on" a second element, the first element may be positioned above and contact the second element or may merely be above the second element with one or more additional elements disposed between the first and second elements.

Although the terms "first," "second," and the like may be used herein to describe various elements, these elements should not be interpreted to be limited by these terms as they are not used to define a particular essence, order, sequence, precedence, or number of such elements. These terms are used only to distinguish one element from another. For example, a first element could be termed a second element, and a second element could similarly be termed a first element, without departing from the scope of the present disclosure.

Features of various embodiments of the present disclosure can be partially or wholly coupled to or combined with each other, and may be operated, linked, or driven together in various ways as those skilled in the art can sufficiently understand. The embodiments of the present disclosure may be carried out independently from each other, or may be carried out together in a co-dependent or related relationship.

The terms used below should be understood in consideration of the functions of the described embodiments of the present specification and may have different meanings according to the intention of a user, an operator, or the like. Therefore, the terms should be understood based on the contents and context of the specification.

A transistor included in a pixel circuit of the present disclosure may include at least one of an oxide thin film transistor Oxide TFT, an amorphous silicon a-Si TFT, and a low temperature polysilicon LTPS TFT.

The following example embodiments are described with respect to an organic light emitting display apparatus. However, embodiments of the present disclosure are not limited to the organic light emitting display apparatus and can be applied to other types of display apparatuses, such as an inorganic light emitting display apparatus including an inorganic light emitting material, a quantum dot display apparatus, a liquid crystal display apparatus, and the like. Hereinafter, example embodiments of the present disclosure will be described with reference to the drawings. In one or more aspects, the components of each display apparatus according to various embodiments of the present disclosure may be operatively coupled and configured.

FIG. 1 is a functional block view illustrating a display apparatus according to an example embodiment of the present disclosure.

The display apparatus according to an example embodiment of the present disclosure can be applied with an electroluminescent display apparatus. The electroluminescent display apparatus can be an Organic Light Emitting Diode display apparatus, a Quantum-dot Light Emitting Diode display apparatus, or an Inorganic Light Emitting Diode display apparatus.

As illustrated in FIG. 1, the display apparatus may include a display panel DP, a data driver DD, a gate driver GD, a timing controller TC, and a power unit PU.

In the example embodiment, the display panel DP can generate an image to be provided to a user. For example, the display panel DP can generate and display an image to be provided to the user through a pixel area PA in which a pixel circuit is disposed.

Figure 2:
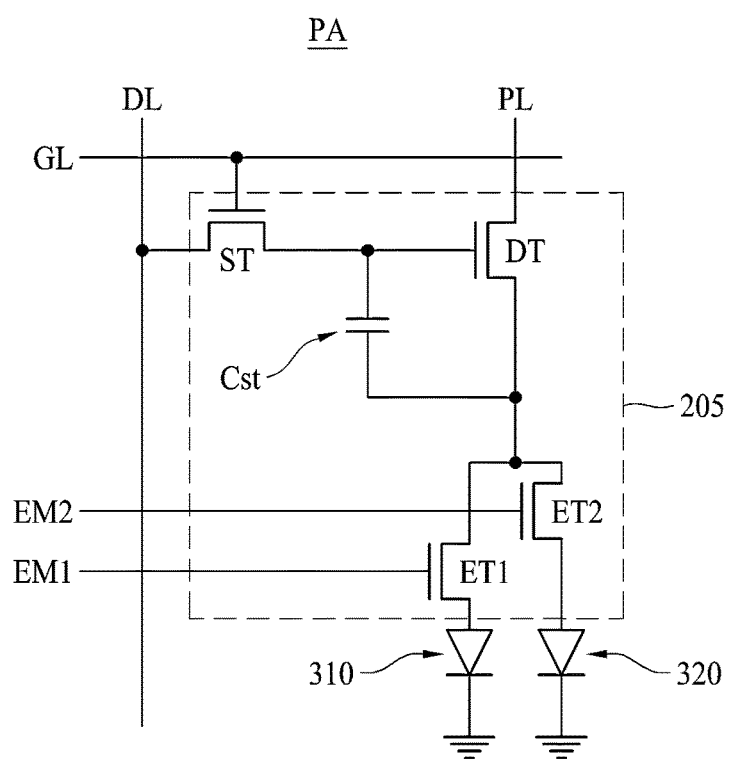
FIG. 2 is a view illustrating an example of a pixel circuit of a display apparatus according to an example embodiment of the present disclosure.

The data driver DD, the gate driver GD, the timing controller TC, and the power unit PU can provide a signal for the operation of each pixel area PA through signal lines. The signal lines may include, for example, data lines DL, gate lines GL, and power voltage supply lines PL, which are shown in FIG. 2.

For example, the data driver DD can apply a data signal to each pixel area PA through the data lines DL, the gate driver GD can apply a gate signal to each pixel area PA through the gate lines GL, and the power unit PU can supply a power voltage to each pixel area PA through the power voltage supply lines PL.

The timing controller TC can control the data driver DD and the gate driver GD. For example, the timing controller TC may realign digital video data input from an external source in accordance with the resolution of the display panel DP and may supply the realigned digital video data to the data driver DD.

The data driver DD can convert the digital video data input from the timing controller TC into an analog data voltage based on a data control signal and can supply the analog data voltage to the plurality of data lines.

The gate driver GD can generate a scan signal and a light emission signal (or light emission control signal) based on a gate control signal. The gate driver GD may include a scan driver and a light emission signal driver. The scan driver may generate scan signals in a row sequential manner to drive at least one scan line connected to each pixel row and may supply the scan signals to the scan lines. The light emission signal driver may generate light emission signals in a row sequential manner to drive at least one light emission signal line connected to each pixel row and may supply the light emission signals to the light emission signal lines.

According to the example embodiment, the gate driver GD may be disposed on the display panel DP in accordance with a Gate-driver In Panel (GIP) method. For example, the gate driver GD may be divided into a plurality of gate drivers GD and then be disposed on at least two sides of the display panel DP, respectively. For another example, the gate driver GD may be disposed in the display area AA.

The display area AA of the display panel DP may include a plurality of pixel areas PA (or pixels or pixel circuits). A plurality of data lines (e.g., the data lines DL of FIG. 2) and a plurality of gate lines (e.g., the gate lines GL in FIG. 2) may cross with each other in the pixel area PA, and subpixels disposed in each crossing area may be included in the pixel area PA. The respective subpixels included in one pixel area PA can emit light of their respective colors different from each other. For example, the pixel area PA may implement blue, red, and green colors by using three subpixels, but is not limited thereto. The pixel area PA may further include a subpixel for further implementing a specific color (e.g., white or yellow) in some example embodiments.

In the pixel area PA, an area implementing blue may be referred to as a blue subpixel area, an area implementing red may be referred to as a red subpixel area, and an area implementing green may be referred to as a green subpixel area.

In the example embodiment, the pixel area PA may include a plurality of subpixels. Each of the plurality of subpixels may be divided into a first lens area and a second lens area, which provide their respective viewing angles different from each other. For example, the pixel area PA may include a first lens area that provides light to a first region to form a first viewing angle and a second lens area that provides light to a second region to form a second viewing angle. The first region may correspond to a wider region than the second region. This will be described in more detail with reference to FIG. 3.

A non-display area BZ may be disposed along the periphery of the display area AA. Various elements for driving the pixel circuit disposed in the pixel area PA may be disposed in the non-display area BZ. For example, at least a portion of the gate driver GD may be disposed in the non-display area BZ. The non-display area BZ can be referred to as a bezel area.

FIG. 2 illustrates an example of a pixel circuit of a display apparatus according to an example embodiment of the present disclosure. The pixel area PA may include a plurality of subpixels representing different colors and a pixel circuit corresponding to each of the plurality of subpixels. FIG. 2 illustrates an example of a pixel circuit corresponding to one subpixel disposed in the pixel area PA.

As shown in FIG. 2, the pixel circuit may include a plurality of transistors DT, ST, ET1, and ET2, a capacitor Cst, and a plurality of light emitting elements 310 and 320.

The driving transistor DT and the capacitor Cst may be connected to the switching transistor ST. A first electrode of the driving transistor DT may be connected to the power voltage supply line PL.

The switching transistor ST may be connected to the gate line GL to receive the gate signal. The switching transistor ST can be turned on or off by the gate signal. A first electrode of the switching transistor ST may be connected to the data line DL. In this case, the data signal can be supplied to a gate electrode of the driving transistor DT through the switching transistor ST in response to the switching transistor ST being turned-on.

The capacitor Cst may be disposed between the gate electrode and a second electrode of the driving transistor DT. The capacitor Cst can maintain a signal, for example, a data signal, applied to the gate electrode of the driving transistor DT during one or more frames.

According to the example embodiment, the driving transistor DT, the switching transistor ST, and the capacitor Cst can be elements for driving the light emitting elements (e.g., the first light emitting element 310 and the second light emitting element 320), and can be referred to as driving portions 205, but are not limited to such terms.

The first light emitting element 310 may be connected to the first transistor ET1 which may be turned on or off by a first light emission signal EM1. The second light emitting element 320 may be connected to the second transistor ET2 which may be turned on or off by a second light emission signal EM2. The driving portion 205 of the pixel circuit may further include the first and second transistors ET1 and ET2.

In this case, the first light emitting element 310 or the second light emitting element 320 may be connected to another element of the pixel circuit, for example, the driving transistor DT in accordance with an applicable mode. The mode may be designated by a user input or may be determined when a predesignated condition is satisfied. For example, when a predesignated first condition is satisfied, the first light emitting element 310 may emit light based on the supply of the first light emission signal EM1. When a predesignated second condition is satisfied, the second light emitting element 320 may emit light based on the supply of the second light emission signal EM2. The first condition may include a predesignated condition for driving a first mode. The second condition may include a predesignated condition for driving a second mode.

The plurality of transistors illustrated in FIG. 2 may include at least one of amorphous silicon, polycrystalline silicon, and oxide semiconductor, such as IGZO. The first electrode or the second electrode of each transistor may be a source electrode or a drain electrode. For example, the first electrode may be a source electrode, and the second electrode may be a drain electrode. For another example, the first electrode may be a drain electrode, and the second electrode may be a source electrode.

Figure 3:
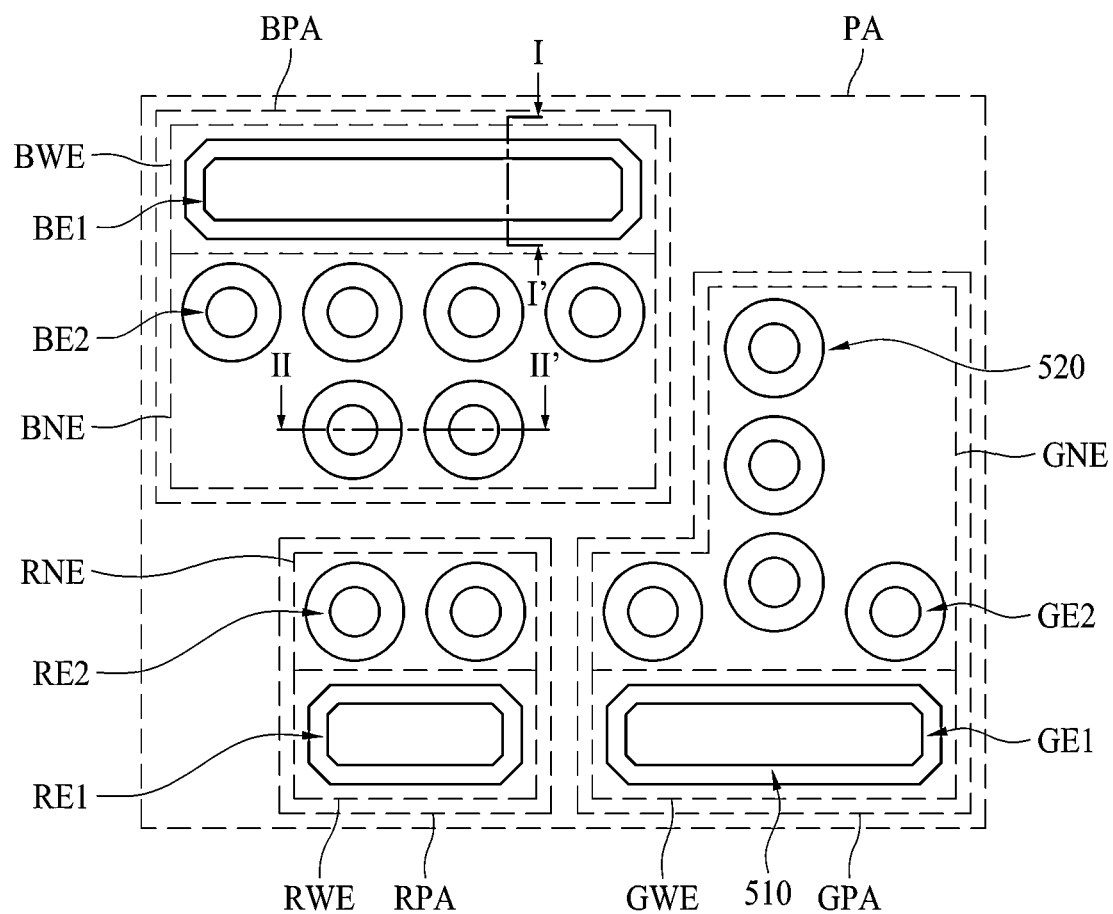
FIG. 3 is a plan view illustrating a portion of a display apparatus according to an example embodiment of the present disclosure.
Figure 4:
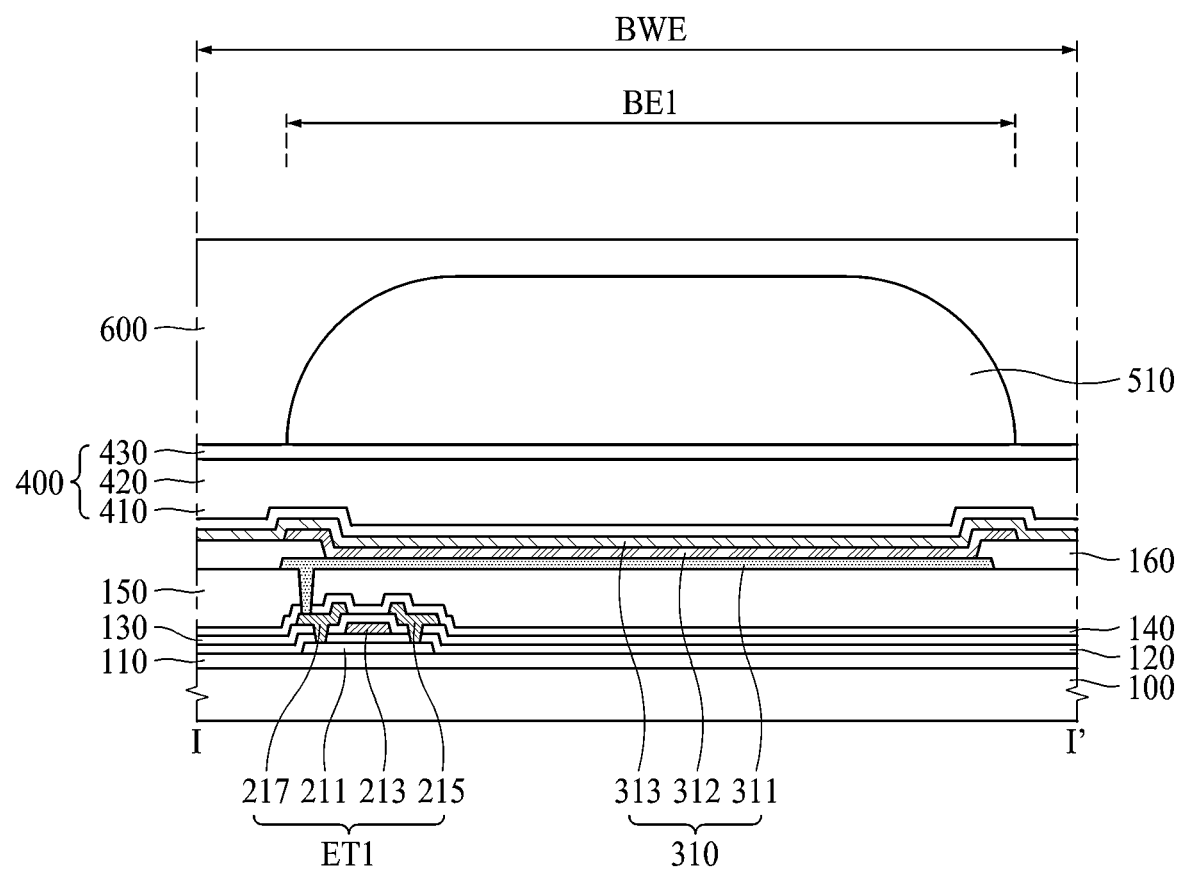
FIG. 4 is an example cross-sectional view taken along line I-I' in FIG. 3.
Figure 5:
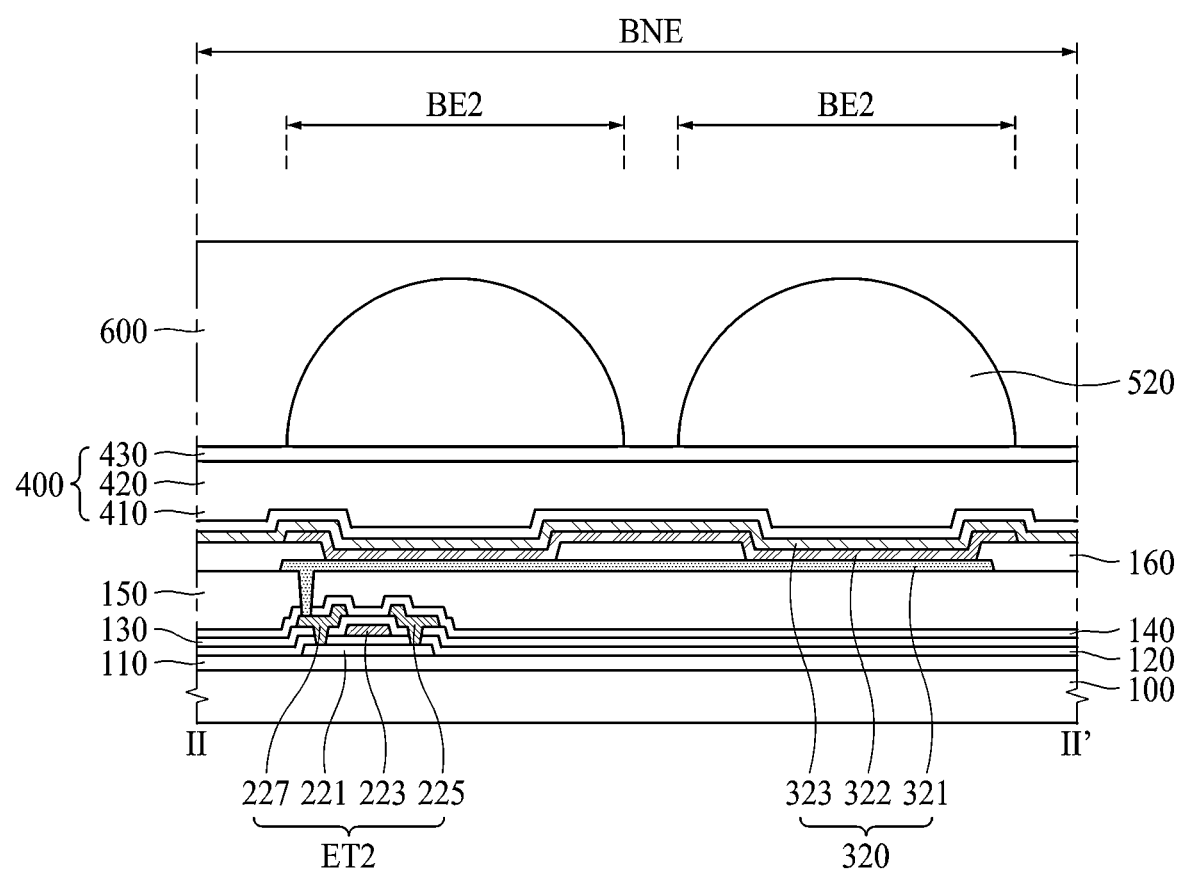
FIG. 5 is an example cross-sectional view taken along line II-IF in FIG. 3.

FIG. 3 illustrates a plan view of a portion of a display apparatus according to an example embodiment of the present disclosure. FIG. 3 illustrates a plan view of an example pixel area PA where three subpixels are disposed. FIG. 4 is an example cross-sectional view taken along line I-I' in FIG. 3, and FIG. 5 is an example cross-sectional view taken along line II-IF in FIG. 3. Hereinafter, the description will be provided with reference to FIGS. 3 to 5.

In FIG. 3, the pixel area PA may include a blue subpixel area BPA for implementing blue, a red subpixel area RPA for implementing red, and a green subpixel area GPA for implementing green. According to the example embodiment, the blue subpixel area BPA may correspond to a first subpixel, the red subpixel area RPA may correspond to a second subpixel, and the green subpixel area GPA may correspond to a third subpixel. A pixel circuit may be provided for each of the subpixels. A corresponding pixel circuit may be disposed for each of the subpixels.

The pixel area PA may include first lens areas BWE, RWE and GWE and second lens areas BNE, RNE and GNE, which provide different viewing angles from the first lens areas. The second lens areas BNE, RNE and GNE of each pixel area PA may operate independently of the first lens areas BWE, RWE and GWE of the corresponding pixel area PA. For example, each pixel area PA may include a first light emitting element 310 (e.g., the first light emitting element 310 in FIG. 2) positioned on the first lens areas BWE, REW and GWE of the corresponding pixel area PA and a second light emitting element 320 (e.g., the second light emitting element 320 in FIG. 2) positioned on the second lens areas BNE, RNE and GNE of the corresponding pixel area PA.

In the example embodiment, at least one first lens 510 may be disposed in each of the first lens areas BWE, RWE and GWE. At least one second lens 520 may be disposed in each of the second lens areas BNE, RNE and GNE. For example, one first lens 510 may be disposed in each of the first lens areas BWE, RWE and GWE, and two or more second lenses 520 may be disposed in each of the second lens areas BNE, RNE and GNE.

In the example embodiment, sizes of at least some of the first lenses 510 respectively included in the first lens areas BWE, RWE and GWE may be different from each other. For example, the size of the first lens 510 included in the first lens area BWE corresponding to blue may be different from the size of the first lens 510 included in the first lens area RWE corresponding to red.

In the example embodiment, the numbers of second lenses 520 respectively included in at least two areas among the second lens area BNE corresponding to blue, the second lens area RNE corresponding to red, and the second lens area GNE corresponding to green may be different from each other. For example, the number of second lenses 520 included in the second lens area BNE corresponding to blue and the number of second lenses 520 included in the second lens area RNE corresponding to red may be different from each other. For another example, the number of second lenses 520 included in the second lens area GNE corresponding to green and the number of second lenses 520 included in the second lens area RNE corresponding to red may be different from each other.

The first light emitting element 310 may emit light representing a specific color. For example, the first light emitting element 310 may include a first lower electrode 311, a first light emitting layer 312, and a first upper electrode 313, which are sequentially stacked on a substrate 100. The substrate 100 may include an insulating material. The substrate 100 may include a transparent material. For example, the substrate 100 may include glass or plastic.

The first lower electrode 311 may include a conductive material. The first lower electrode 311 may include a material having high reflectance. For example, the first lower electrode 311 may include a metal, such as aluminum (Al) or silver (Ag). The first lower electrode 311 may have a multi-layered structure. For example, the first lower electrode 311 may have a structure in which a reflective electrode made of metal is positioned between transparent electrodes made of a transparent conductive material, such as ITO or IZO.

The first light emitting layer 312 may generate light of luminance corresponding to a voltage difference between the first lower electrode 311 and the first upper electrode 313. For example, the first light emitting layer 312 may include an Emission Material Layer (EML) that includes a light emitting material. The light emitting material may include an organic material, an inorganic material, or a hybrid material.

The first light emitting layer 312 may have a multi-layered structure. For example, the first light emitting layer 312 may further include at least one of a Hole Injection Layer (HIL), a Hole Transport Layer (HTL), an Electron Transport Layer (ETL), or an Electron Injection Layer (EIL).

The first upper electrode 313 may include a conductive material. The first upper electrode 313 may include a material different from that of the first lower electrode 311. Transmittance of the first upper electrode 313 may be higher than that of the first lower electrode 311. For example, the first upper electrode 313 may be a transparent electrode made of a transparent conductive material, such as ITO or IZO. Therefore, in the display apparatus according to the example embodiment of the present disclosure, light generated by the first light emitting layer 312 may be emitted through the first upper electrode 313.

The second light emitting element 320 may implement the same color as that of the first light emitting element 310. The second light emitting element 320 may have the same structure as that of the first light emitting element 310. For example, the second light emitting element 320 may include a second lower electrode 321, a second light emitting layer 322, and a second upper electrode 323, which are sequentially stacked on the substrate 100.

The second lower electrode 321 may correspond to the first lower electrode 311, the second light emitting layer 322 may correspond to the first light emitting layer 312, and the second upper electrode 323 may correspond to the first upper electrode 313. For example, the second lower electrode 321, the second light emitting layer 322, and the second upper electrode 323 may be formed with respect to the second light emitting element 320 in the same structure as the first lower electrode 311, the first light emitting layer 312, and the first upper electrode 313, respectively. That is, the first light emitting element 310 and the second light emitting element 320 may be formed to have the same structure, but the present disclosure is not limited thereto. In some cases, at least some respective elements of the first light emitting element 310 and the second light emitting element 320 may be formed differently from each other.

In the example embodiment, the second light emitting layer 322 may be spaced apart from the first light emitting layer 312. Therefore, in the display apparatus according to the example embodiment of the present disclosure, light emission due to leakage current can be avoided. Also, in the display apparatus according to the example embodiment of the present disclosure, light can be generated only in one of the first light emitting layer 312 and the second light emitting layer 322 at a time in accordance with a user's selection or a predesignated condition.

In the example embodiment, the first light emitting element 310 and the second light emitting element 320 of the pixel area PA may be positioned on a driving portion (e.g., the driving portion 205 in FIG. 2) of the corresponding pixel area PA. For example, at least one insulating film (e.g., an element buffer film 110, a gate insulating film 120, an interlayer insulating film 130, a lower passivation film 140, and an overcoat layer 150) may be positioned on the substrate 100, and the first light emitting element 310 and the second light emitting element 320 of each pixel area PA may be disposed on one of the insulating films. Therefore, in the display apparatus according to the example embodiment of the present disclosure, the first light emitting element 310 and the second light emitting element 320 of each pixel area PA may be prevented from being unnecessarily connected to the driving portion 205 of the corresponding pixel area PA.

In the example embodiment, the element buffer film 110, the gate insulating film 120, the interlayer insulating film 130, the lower passivation film 140, and the overcoat layer 150 may be stacked on the substrate 100. The element buffer film 110 may include an insulating material. For example, the element buffer film 110 may include an inorganic insulating material, such as silicon oxide (SiO) or silicon nitride (SiN). The element buffer film 110 may have a multi-layered structure. For example, the element buffer film 110 may have a stacked structure of a film made of silicon nitride (SiN) and a film made of silicon oxide (SiO).

In the example embodiment, the element buffer film 110 may be positioned between the substrate 100 and the driving portion 205 of each pixel area PA. The element buffer film 110 can prevent contamination caused by the substrate 100 in a process of forming the driving portion 205. For example, an upper surface of the substrate 100 directed toward the driving portion 205 of each pixel area PA may be covered by the element buffer film 110. The driving portion 205 of each pixel area PA may be positioned on the element buffer film 110.

In the example embodiment, the gate insulating film 120 may include an insulating material. For example, the gate insulating film 120 may include an inorganic insulating material, such as silicon oxide (SiO) or silicon nitride (SiN). The gate insulating film 120 may include a material having a high dielectric constant. For example, the gate insulating film 120 may include a High-K material, such as hafnium oxide (HfO). The gate insulating film 120 may have a multi-layered structure.

The gate insulating film 120 may be positioned on the element buffer film 110. The gate insulating film 120 may be disposed between a gate electrode and a semiconductor pattern of a transistor. For example, the gate electrode of the driving transistor DT and the switching transistor ST may be insulated respectively from the semiconductor pattern of the driving transistor DT and the switching transistor ST by the gate insulating film 120. The gate insulating film 120 may cover a first semiconductor pattern (e.g., 211 in FIG. 4) and a second semiconductor pattern (e.g., 221 in FIG. 5) of each pixel area PA. The gate electrode of the driving transistor DT and the switching transistor ST may be positioned on the gate insulating film 120.

The interlayer insulating film 130 may include an insulating material. For example, the interlayer insulating film 130 may include an inorganic insulating material, such as silicon oxide (SiO) or silicon nitride (SiN). The interlayer insulating film 130 may be positioned on the gate insulating film 120. The interlayer insulating film 130 may be disposed between the gate electrode and the source electrode of each of the driving transistor DT and the switching transistor ST and may be disposed between the gate electrode and the drain electrode thereof. For example, the source electrode and the drain electrode of each of the driving transistor DT and the switching transistor ST may be insulated from the gate electrode thereof by the interlayer insulating film 130. The interlayer insulating film 130 may cover the gate electrode of each of the driving transistor DT and the switching transistor ST. A source electrode and a drain electrode of each pixel area PA may be disposed on the interlayer insulating film 130. A source area and a drain area of each semiconductor pattern positioned in each pixel area PA may be exposed through openings or holes in the gate insulating film 120 and the interlayer insulating film 130.

In the example embodiment, the lower passivation film 140 may include an insulating material. For example, the lower passivation layer 140 may include an inorganic insulating material, such as silicon oxide (SiO) or silicon nitride (SiN). The lower passivation film 140 may be positioned on the interlayer insulating film 130. The lower passivation layer 140 can prevent the driving portion 205 from being damaged due to external moisture and impact. The lower passivation film 140 may be disposed along surfaces of the switching transistor ST and the driving transistor DT, which face away from the substrate 100. The lower passivation film 140 may be in contact with the interlayer insulating film 130 outside the driving portion 205 positioned in each pixel area PA.

The overcoat layer 150 may include an insulating material. The overcoat layer 150 may include a material different from that of the lower passivation film 140. For example, the overcoat layer 150 may include an organic insulating material. The overcoat layer 150 may be positioned on the lower passivation film 140. The overcoat layer 150 may remove a step difference caused by the driving portion 205 of each pixel area PA. For example, an upper surface of the overcoat layer 150 facing away from the substrate 100 may be a flat surface.

In the example embodiment, the first transistor ET1 may be electrically connected between the drain electrode of the driving transistor DT and the first lower electrode 311 of the first light emitting element 310. The second transistor ET2 may be electrically connected between the drain electrode of the driving transistor DT and the second lower electrode 321 of the second light emitting element 320.

The first transistor ET1 may include a first semiconductor pattern 211, a first gate electrode 213, a first source electrode 215, and a first drain electrode 217. The first transistor ET1 may have the same or similar structure as that of switching transistor ST and the driving transistor DT. For example, the first semiconductor pattern 211 may be positioned between the element buffer film 110 and the gate insulating film 120, and the first gate electrode 213 may be positioned between the gate insulating film 120 and the interlayer insulating film 130. The first source electrode 215 and the first drain electrode 217 may be positioned between the interlayer insulating film 130 and the lower passivation film 140. The first gate electrode 213 may overlap a channel area of the first semiconductor pattern 211. The first source electrode 215 may be electrically connected to a source area of the first semiconductor pattern 211. The first drain electrode 217 may be electrically connected to a drain area of the first semiconductor pattern 211.

In the example embodiment, the second transistor ET2 may include a second semiconductor pattern 221, a second gate electrode 223, a second source electrode 225 and a second drain electrode 227. For example, the second semiconductor pattern 221 may be positioned on the same layer as the first semiconductor pattern 211, the second gate electrode 223 may be positioned on the same layer as the first gate electrode 213, and the second source electrode 225 and the second drain electrode 227 may be positioned on the same layer as the first source electrode 215 and the first drain electrode 217.

In the example embodiment, the first transistor ET1 may be formed simultaneously with the switching transistor ST and the driving transistor DT. The first transistor ET1 may be formed simultaneously with the second transistor ET2.

The first light emitting element 310 and the second light emitting element 320 of each pixel area PA may be positioned on the overcoat layer 150 of the corresponding pixel area PA. For example, the first lower electrode 311 of the first light emitting element 310 may be electrically connected to the first drain electrode 217 of the first transistor ET1 via a contact hole through the lower passivation film 140 and the overcoat layer 150. The second lower electrode 321 of the second light emitting element 320 may be electrically connected to the second drain electrode 227 of the second transistor ET2 via another contact hole through the lower passivation film 140 and the overcoat layer 150.

The second lower electrode 321 of each pixel area PA may be spaced apart from the first lower electrode 311 of the corresponding pixel area PA. For example, a bank insulating film 160 may be positioned between the first lower electrode 311 and the second lower electrode 321 of each pixel area PA. The bank insulating film 160 may include an insulating material. For example, the bank insulating film 160 may include an organic insulating material. The bank insulating film 160 may include a material different from that of the overcoat layer 150.

The second lower electrode 321 of each pixel area PA may be insulated from the first lower electrode 311 of the corresponding pixel area PA by the bank insulating film 160. For example, the bank insulating film 160 may cover the edge of the first lower electrode 311 and the edge of the second lower electrode 321, which are positioned in each pixel area PA. Therefore, in the example display apparatus, an image through the first lens areas BWE, RWE and GWE of each pixel area PA in which the first light emitting element 310 is positioned or an image through the second lens areas BNE, RNE and GNE of each pixel area PA in which the second light emitting element 320 is positioned may be provided to the user.

The first light emitting layer 312 and the first upper electrode 313 of the first light emitting element 310 positioned in each pixel area PA may be stacked on a portion of the corresponding first lower electrode 311 exposed through the bank insulating film 160. The second light emitting layer 322 and the second upper electrode 323 of the second light emitting element 320 positioned in each pixel area PA may be stacked on a portion of the corresponding second lower electrode 321 exposed through the bank insulating film 160. For example, in each pixel area PA, the bank insulating film 160 may separate or define the first light emitting areas BE1, RE1 and GE1 from which light is emitted by the first light emitting element 310 from the second light emitting areas BE2, RE2 and GE2 from which light is emitted by the second light emitting element 320. The size of each of the second light emitting areas BE2, RE2 and GE2 defined in each pixel area PA may be smaller than that of each of the corresponding first light emitting areas BE1, RE1 and GE1.

The second upper electrode 323 of each pixel area PA may be electrically connected to the first upper electrode 313 of the corresponding pixel area PA. For example, a voltage applied to the second upper electrode 323 of the second light emitting element 320 positioned in each pixel area PA may be the same as that applied to the first upper electrode 313 of the first light emitting element 310 positioned in the corresponding pixel area PA. The second upper electrode 323 of each pixel area PA may include the same material as that of the first upper electrode 313 of the corresponding pixel area PA. For example, the second upper electrode 323 of each pixel area PA may be formed simultaneously with the first upper electrode 313 of the corresponding pixel area PA. The second upper electrode 323 of each pixel area PA may extend over the bank insulating film 160 to directly contact the first upper electrode 313 of the corresponding pixel area PA. Luminance of the first lens areas BWE, RWE and GWE positioned in each pixel area PA and luminance of the second lens areas BNE, RNE and GNE can be controlled by a driving current generated in the corresponding pixel area PA.

An encapsulation member 400 may be positioned on the first light emitting element 310 and the second light emitting element 320 of each pixel area PA. The encapsulation member 400 can prevent the light emitting elements 310 and 320 from being damaged due to external moisture and impact. The encapsulation member 400 may have a multi-layered structure. For example, the encapsulation member 400 may include a first encapsulation layer 410, a second encapsulation layer 420, and a third encapsulation layer 430, which are sequentially stacked. The first encapsulation layer 410, the second encapsulation layer 420, and the third encapsulation layer 430 may include an insulating material. The second encapsulation layer 420 may include a material different from that of the first encapsulation layer 410 and the third encapsulation layer 430. For example, the first encapsulation layer 410 and the third encapsulation layer 430 may include an inorganic insulation material, and the second encapsulation layer 420 may include an organic insulation material. Therefore, a potential damage on the light emitting elements 310 and 320 of the display apparatus due to external moisture an impact may be more effectively prevented.

The first lens 510 and the second lens 520 may be positioned on the encapsulation member 400 of each pixel area PA.

The first lens 510 may be positioned in the first lens areas BWE, RWE and GWE of each pixel area PA. For example, light generated by the first light emitting element 310 of each pixel area PA may be emitted through the first lens 510 of the corresponding pixel area PA. The first lens 510 may have a shape in which light propagating in at least one direction is not limited. For example, a planar shape of the first lens 510 positioned in each pixel area PA may be a bar shape extended in the first direction.

In this case, a moving direction of light emitted from the first lens areas BWE, RWE and GWE of the pixel area PA may not be limited in the first direction. For example, a content (or image) provided through the first lens areas BWE, RWE and GWE of the pixel area PA can be viewed by other people adjacent to the user in the first direction. The mode in which the content is provided through the first lens areas BWE, RWE and GWE is a mode for providing the content in a first viewing angle range wider than a second viewing angle range provided by the second lens areas BNE, RNE and GNE, and can be referred to as a first mode.

The second lens 520 may be positioned in the second lens areas BNE, RNE and GNE of each pixel area PA. Light generated by the second light emitting element 320 of the pixel area PA may be emitted through the second lens 520 of the corresponding pixel area PA. The second lens 520 can limit a propagating direction of light, which passes therethrough, to the first direction and/or the second direction. For example, a planar shape of the second lens 520 positioned in the pixel area PA may be a circular shape. In this case, the propagating direction of light emitted from the second lens areas BNE, RNE and GNE of the pixel area PA can be limited to the first direction and the second direction. That is, the content provided by the second lens areas BNE, RNE and GNE of the pixel area PA may not be viewed or clearly viewed by other people around the user. The mode in which the content is provided through the second lens areas BNE, RNE and GNE is a mode for providing the content in a second viewing angle range narrower than a first viewing angle range provided by the first lens areas BWE, RWE and GWE, and can be referred to as a second mode.

The first light emitting areas BE1, RE1 and GE1 included respectively in the first lens areas BWE, RWE and GWE of each pixel area PA may have a shape corresponding to the first lens 510 positioned in the first lens areas BWE, RWE and GWE of the corresponding pixel area PA. For example, a planar shape of the first light emitting areas BE1, RE1 and GE1 defined in the first lens areas BWE, RWE and GWE of each pixel area PA may be a bar shape extended in the first direction. The first lens 510 positioned in the first lens areas BWE, RWE and GWE of the pixel area PA may have a size greater than that of the corresponding first light emitting areas BE1, RE1 and GE1 included in the first lens areas BWE, RWE and GWE of the corresponding pixel area PA. Therefore, efficiency of light emitted from the first light emitting areas BE1, RE1 and GE1 of the pixel area PA can be improved.

The second light emitting areas BE2, RE2 and GE2 included respectively in the second lens areas BNE, RNE and GNE of each pixel area PA may have a shape corresponding to the second lens 520 positioned in the second lens areas BNE, RNE and GNE of the corresponding pixel area PA. For example, a planar shape of the second light emitting areas BE2, RE2 and GE2 included in the second lens areas BNE, RNE and GNE of the pixel area PA may be a circular shape. The second lens 520 positioned in the second lens areas BNE, RNE and GNE of the pixel area PA may have a size greater than that of the corresponding second light emitting areas BE2, RE2 and GE2 included in the second lens areas BNE, RNE and GNE of the corresponding pixel area PA. For example, the planar shape of the second light emitting areas BE2, RE2 and GE2 positioned in the second lens areas BNE, RNE and GNE of each pixel area PA may be concentric with the planar shape of the second lens 520 positioned on the second lens areas BNE, RNE and GNE of the corresponding pixel area PA. In this case, efficiency of light emitted from the second light emitting areas BE2, RE2 and GE2 of the pixel area PA can be improved.

In the example embodiment, the first lens area BWE, RWE or GWE of the pixel area PA may include one corresponding first light emitting area BE1, RE1 or GE1. The second lens areas BNE, RNE and GNE of the pixel area PA may include a plurality of corresponding second light emitting areas BE2, RE2 and GE2.

In the example embodiment, one first lens 510 may be disposed in each of the first lens areas BWE, RWE and GWE of the pixel area PA. A plurality of second lenses 520 may be disposed in each of the second lens areas BNE, RNE and GNE of the pixel area PA.

In an example embodiment, the second light emitting areas BE2, RE2 and GE2 included respectively in the second lens areas BNE, RNE and GNE of the pixel area PA may be driven for each subpixel area. The second light emitting areas (e.g., second light emitting areas BE2, second light emitting areas RE2, or second light emitting areas GE2) included in one subpixel area may be simultaneously driven.

In the example embodiment, one second lower electrode 321 may be positioned respectively in the second lens areas BNE, RNE and GNE of each pixel area PA. As illustrate in FIG. 5, the bank insulating film 160 may be disposed between the second lower electrode 321 and the second light emitting layer 322 at areas between the second light emitting areas BE2, RE2 and GE2. At areas between the second light emitting areas BE2 and RE2, between the second light emitting areas RE2 and GE2, and/or between the second light emitting areas GE2 and BE2, the bank insulating film 160 may be disposed between the second lower electrode 321 and the second light emitting layer 322. The second light emitting layer 322 may be spaced apart from the second lower electrode 321 by the bank insulating film 160 at areas between the second light emitting areas BE2, RE2 and GE2 of the respective second lens areas BNE, RNE and GNE. In this case, light emitting efficiency of the second light emitting areas BE2, RE2 and GE2 can be improved.

In the example embodiment, a planar area of each of the second light emitting areas BE2, RE2 and GE2 positioned in the corresponding one of the second lens areas BNE, RNE and GNE of the pixel area PA may be designated by a specific value. For example, the second light emitting areas BE2, RE2 and GE2 positioned respectively in the second lens areas BNE, RNE and GNE may be implemented to have the same planar area. Each of the second light emitting areas BE2, RE2 and GE2 positioned respectively in the second lens areas BNE, RNE and GNE of the pixel area PA may have the same planar area as the corresponding one of the second light emitting areas BE2, RE2 and GE2 included respectively in the second lens areas BNE, RNE and GNE of another adjacent pixel area PA.

In the example embodiment, the number of second light emitting areas may be different for each of the subpixel areas RPA, GPA and BPA. For example, the number of second light emitting areas BE2 defined in the second lens area BNE of the blue subpixel area BPA may be greater than the number of second light emitting areas RE2 defined in the second lens area RNE of the red subpixel area RPA. The number of second light emitting areas RE2 defined in the second lens area RNE of the red subpixel area RPA may be greater than the number of second light emitting areas GE2 defined in the second lens area GNE of the green subpixel area GPA. In this case, an efficiency deviation between the second light emitting elements 320 positioned respectively in the second lens areas BNE, RNE and GNE of the pixel area PA can be mitigated by the number of second light emitting areas BE2, RE2 and GE2 defined respectively in the second lens areas BNE, RNE and GNE of each pixel area PA.

In the example embodiment, the planar sizes of first light emitting areas BE1, RE1 and GE1 may be different for each of the subpixel areas RPA, GPA and BPA. For example, the first light emitting area BE1 of the blue subpixel area BPA can have a planar size different from that of the first light emitting area RE1 of the red subpixel area RPA and from that of the first light emitting area GE1 of the green subpixel area GPA. The planar size of the first light emitting area BE1 of the blue subpixel area BPA may be greater than that of the first light emitting area RE1 of the red subpixel area RPA. The planar size of the first light emitting area RE1 of the red subpixel area RPA may be greater than that of the first light emitting area GE1 of the green subpixel area GPA. Therefore, in the display apparatus according to the example embodiment of the present disclosure, a efficiency deviation between the first light emitting elements 310 positioned respectively in the first lens areas BWE, RWW and GWE of each pixel area PA can be mitigated by the different planar sizes of the first light emitting areas BE1, RE1 and GE1 defined respectively in the first lens areas BWE, RWE and GWE of each pixel area PA.

In the example embodiment, a lens passivation film 600 may be positioned on the first lens 510 and the second lens 520 of the pixel area PA. The lens passivation film 600 may include an insulating material. For example, the lens passivation film 600 may include an organic insulation material. A refractive index of the lens passivation film 600 may be smaller than a refractive index of each of the first lens 510 and the second lens 520, which are positioned in each pixel area PA. Therefore, in the display apparatus according to the example embodiment of the present disclosure, light passing through the first lens 510 and the second lens 520 of each pixel area PA may not be reflected in the direction toward the substrate 100 due to a difference in the refractive index from the lens passivation film 600.

Figure 6:
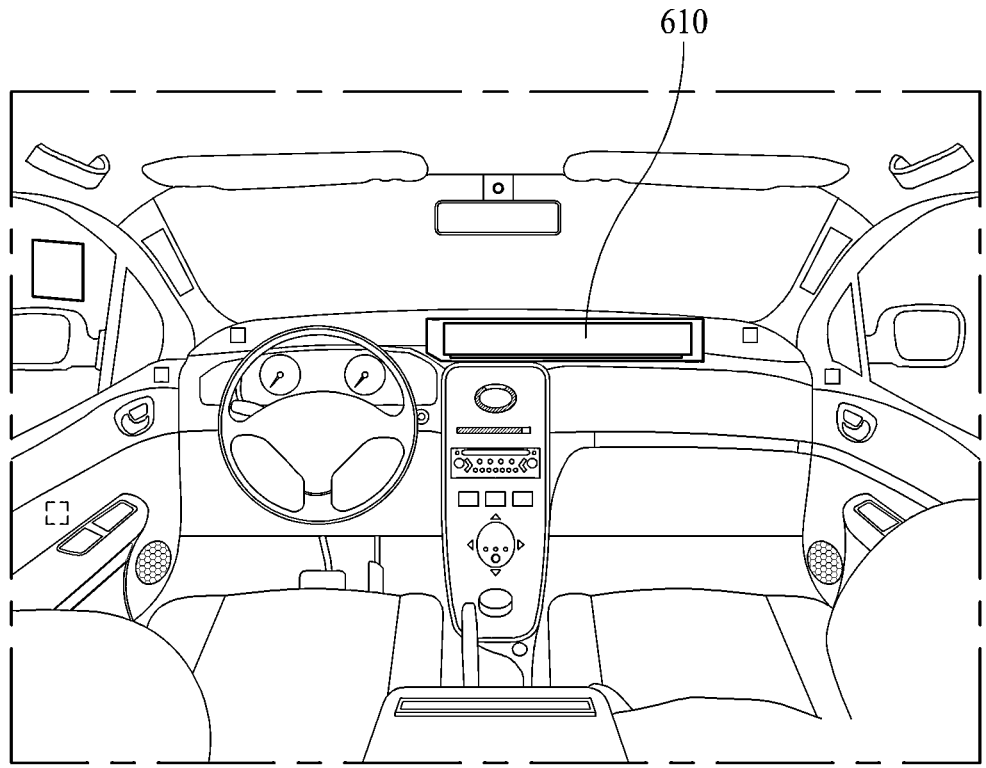
FIG. 6 is an example view illustrating a display apparatus according to an example embodiment of the present disclosure being disposed in a vehicle cabin.

FIG. 6 is an example view illustrating a display apparatus according to an example embodiment of the present disclosure being disposed in a vehicle cabin. FIG. 6 is a detailed view illustrating an example of a display apparatus being disposed in a vehicle.

As illustrated in FIG. 6, a display apparatus 610 may be disposed on at least a portion of a dashboard of a vehicle. The dashboard of the vehicle may include components disposed on a front surface of a front seat (e.g., a driver's seat and a passenger seat) of the vehicle. For example, input components for manipulating various functions (e.g., an air conditioner, an audio system, and a navigation system) inside the vehicle may be disposed on the dashboard of the vehicle.

In the example embodiment, the example display apparatus 610 may be disposed on the dashboard of the vehicle and may operate as an input for manipulating at least some of the various functions of the vehicle. The display apparatus 610 may provide various kinds of information related to the vehicle, for example, driving information (e.g., a current speed of the vehicle, a remaining fuel amount, and a driving distance) of the vehicle, and information (e.g., damage to a vehicle tire) related to components of the vehicle.

The display apparatus 610 may be disposed across a driver's seat and a passenger seat, which are disposed in the front seat of the vehicle, as shown in FIG. 6. A user or users of the display apparatus 610 may include a driver of the vehicle and a passenger on the passenger seat of the vehicle. That is, both the driver and the passenger of the vehicle can use the display apparatus 610.

In the example embodiment, the display apparatus 610 may be divided into a plurality of areas. For example, the display apparatus 610 may be divided into a first area disposed to be adjacent to the driver and a second area disposed to be adjacent to the passenger seat. The first area and the second area may be formed by dividing an area in which a content is displayed in a display area of the display apparatus 610. In this case, the driver's seat of the vehicle may correspond to a seat by which a handle for driving the vehicle is disposed, that is, a seat on which a person driving the vehicle sits. The passenger seat may correspond to a front seat other than the driver's seat and may correspond to a seat on which a front passenger in the vehicle sits.

In the example embodiment, the first area and the second area may be implemented as separate display apparatuses, respectively. However, the present disclosure is not limited thereto, and the first area and second area may correspond to areas divided on one display apparatus 610 as shown, for example, in FIG. 7.

In the example embodiment, the display apparatus 610 shown in FIG. 6 may correspond to at least a portion of a display panel (e.g., the display panel DP in FIG. 1) included in the display apparatus 610. For example, the display apparatus 610 shown in FIG. 6 may represent at least a portion of a display area AA or a non-display area BZ of the display panel DP. The components other than portions illustrated in FIG. 6 of the components of the display apparatus 610 may be packaged inside the vehicle.

Figure 7:
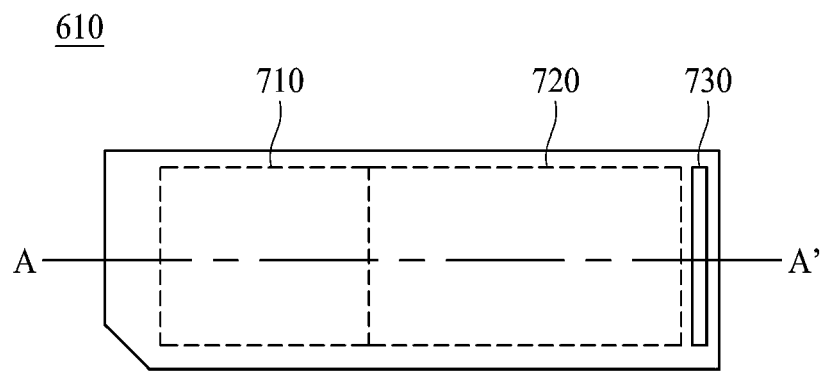
FIG. 7 is a detailed view illustrating a display apparatus according to an example embodiment of the present disclosure.

FIG. 7 is a detailed view illustrating a display apparatus according to an example embodiment of the present disclosure.

As shown in FIG. 7, a display area AA of the display apparatus 610 may be divided into a first area 710 and a second area 720. The first area 710 may include a portion of the display area of the display apparatus 610 adjacent to the driver's seat of the vehicle. The second area 720 may include another portion of the display area of the display apparatus 610 adjacent to the passenger seat of the vehicle.

In the example embodiment, the first area 710 may operate in the first mode, and the second area 720 may operate in the first mode or the second mode. For example, the first area 710 may operate in the first mode with a viewing angle wider than that of the second area 720. The second area 720 may operate in the first mode, or in the second mode with a viewing angle narrower than that of the first area 710. For another example, the first area 710 may operate in the first mode for providing a content to both users positioned in the driver's seat and the passenger seat of the vehicle. The second area 720 may operate in the first mode, or in the second mode for providing a content only to a user positioned in the passenger seat of the vehicle depending on a condition or an input.

In the example embodiment, a size of each of the first area 710 and the second area 720 may be designated in advance. For example, the first area 710 may be designated in advance with a size smaller or larger than that of the second area 720.

For another example, each of the first area 710 and the second area 720 may correspond to 50% of a size of the display area.

In an example embodiment, a gate driver 730 may be disposed at one side of the display area. The gate driver 730 may correspond to the gate driver GD in FIG. 1. In some cases, the gate driver 730 may be arranged at one or more sides of the display area. For example, the gate driver 730 may be disposed at one or more of an upper side, a lower side, a left side, or a right side of the display area. In another example embodiment, the gate driver 730 may be disposed at both left and right sides of the display area.

In the example embodiment, a pixel circuit may be disposed respectively in each of the first area 710 and the second area 720. For example, a first pixel circuit may be disposed in the first area 710, and a second pixel circuit may be disposed in the second area 720. The first pixel circuit and the second pixel circuit may each receive a signal for driving a corresponding light emitting element from the gate driver 730. This will be described below in more detail.

Figure 8:
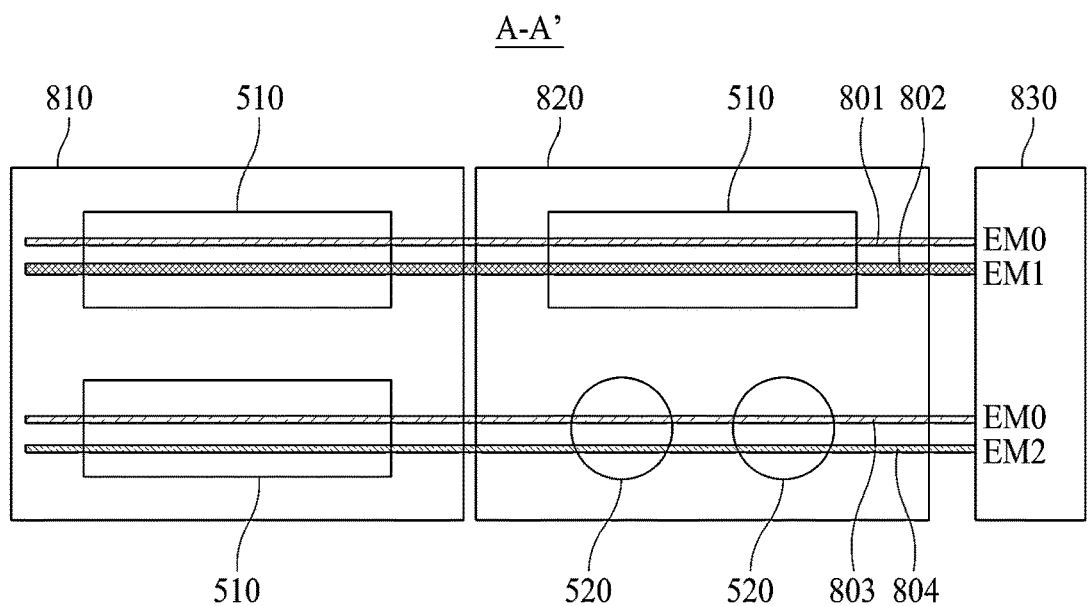
FIGS. 8 and 9 are views illustrating example arrangements of lenses included in a display apparatus according to an example embodiment of the present disclosure.
Figure 9:
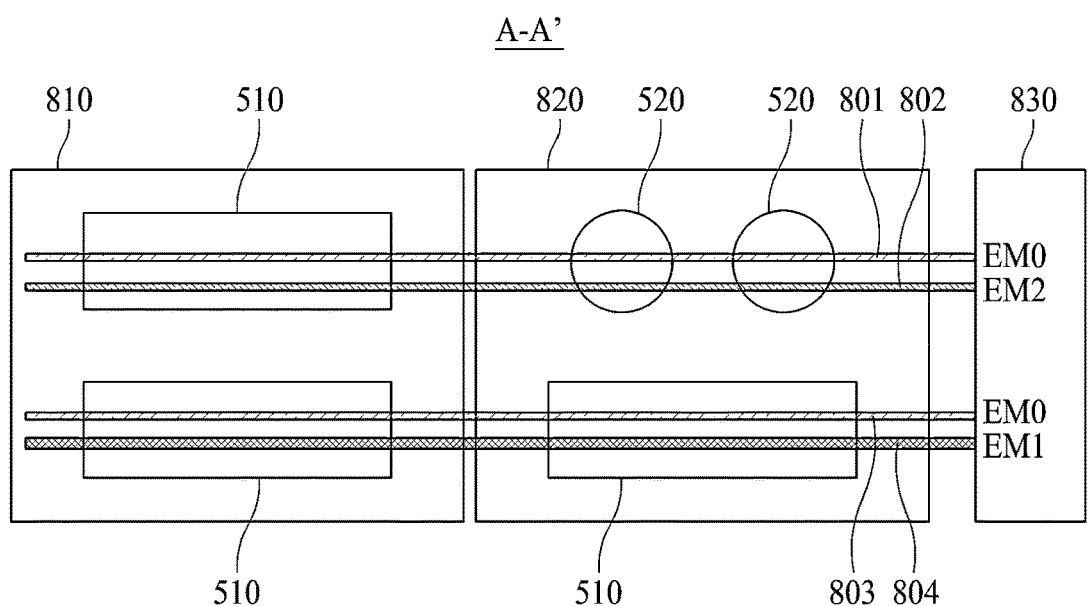
Figure 10:
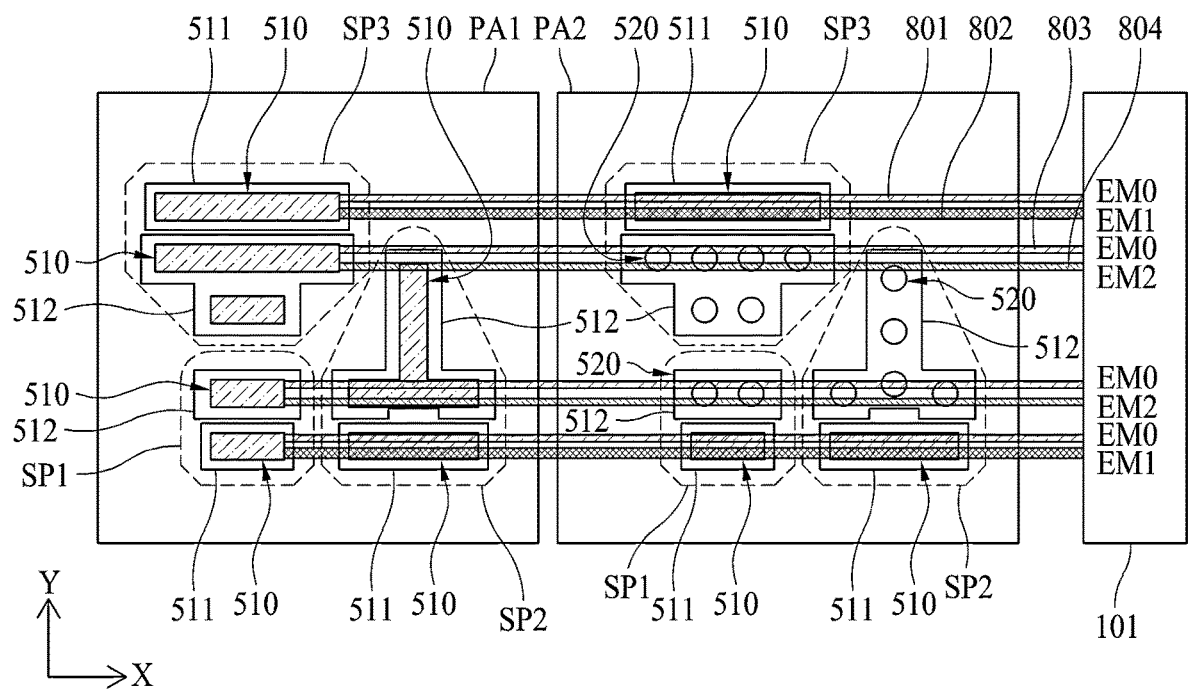
FIG. 10 is a view illustrating an example arrangement of a lens and a pixel area, which are included in a display apparatus according to an example embodiment of the present disclosure.

A lens for controlling a propagating direction of light emitted from the corresponding light emitting element may be disposed respectively on the first pixel circuit and the second pixel circuit. The arrangement of the lens will be described with reference to FIGS. 8 to 10 based on the line A-A' crossing the first area 710 and the second area 720 as shown in FIG. 7. FIGS. 8 to 10 illustrate partial plan views along the line A-A' and are not cross-sectional views.

FIGS. 8 and 9 are views illustrating example arrangements of lenses included in a display apparatus according to an example embodiment of the present disclosure.

FIG. 8 illustrates a first subpixel area 810 disposed along the line A-A' in a first area (e.g., the first area 710 in FIG. 7) of FIG. 7, a second subpixel area 820 disposed along the line A-A' in a second area (e.g., the second area 720 in FIG. 7) of FIG. 7, and a gate driving circuit 830 (at least a portion of the gate driving circuit 730 in FIG. 7) for providing a gate signal to the first subpixel area 810 and the second subpixel area 820.

In more detail, a first pixel area (included in the first area), which includes a plurality of subpixels, and a second pixel area (included in the second area), which includes a plurality of subpixels, can be disposed along the line A-A'. For convenience of description, FIG. 8 illustrates the first subpixel area 810 corresponding to one subpixel among a plurality of subpixels disposed in the first pixel area and the second subpixel area 820 corresponding to one subpixel among a plurality of subpixels disposed in the second pixel area.

as shown in FIG. 8, the first pixel circuit and two first lenses 510 disposed on the first pixel circuit may be disposed in the first subpixel area 810. The second pixel circuit and one first lens 510 and two second lenses 520, which are disposed on the second pixel circuit, may be disposed in the second subpixel area 820.

In an example embodiment, the planar size of the first lens 510, which is connected to a second line 802, among the lenses disposed in the first subpixel area 810 may be different from that of the first lens 510 connected to a fourth line 804. For example, the planar sizes of the first lenses 510, which are connected to the second line 802, can be different from each other. For example, the planar size of the first lens 510 connected to the second line 802 may be greater than that of the first lens 510 connected to the fourth line 804.

In an example embodiment, a first lens 510, which shares the gate line with the second lens 520, among the first lenses 510 disposed in the first subpixel area 810 (for example, the first lens 510 connected to the third line 803 and the fourth line 804 in FIG. 8) may have a planar size smaller than that of another first lens 510. In this case, another first lens 510 may include a first lens 510 that shares the gate line with the first lens 510 disposed in the second subpixel area 820. A first lens 510, which shares the gate line with the second lens 520, among the first lenses 510 disposed in the first subpixel area 810 may be configured to have a planar size based on a light condensing efficiency of the second lens 520. For example, where the light condensing efficiency of the second lens 520 is higher than that of the first lens 510, the first lens 510 sharing the gate line with the second lens 520 may have a reduced planar size in inverse proportion to the light condensing efficiency.

In the example embodiment, where the first lenses 510 disposed in the first subpixel area 810 are formed to have different sizes, center lines of the first lenses 510 may be disposed to be matched with each other. For example, center points of the first lenses 510 disposed in the first subpixel area 810 may be disposed in the first subpixel area 810 along the same column or along the same vertical line.

In the example embodiment, the first pixel circuit of the first subpixel area 810 may include a first light emitting element and a second light emitting element. The first lenses 510 may be disposed respectively on the first light emitting element and the second light emitting element. The second pixel circuit of the second subpixel area 820 may include a third light emitting element and a fourth light emitting element. A first lens 510 may be disposed on the third light emitting element, and second lenses 520 may be disposed on the fourth light emitting element.

In the example embodiment, the first pixel circuit including a first light emitting element and the second pixel circuit including a third light emitting element may be provided with a common light emission signal EM0 and a first light emission signal EM1 from the gate driver 830. For example, in the example illustrated in FIG. 8, the first pixel circuit including a first light emitting element and the second pixel circuit including a third light emitting element may receive the common light emission signal EM0 from the gate driver 830 through the first line 801 and may receive the first light emission signal EM1 from the gate driver 830 through the second line 802 in response to driving of the first mode to allow the first and third light emitting elements to emit light. The first subpixel area 810 may provide a viewing angle of the first mode through the first lens 510 disposed on the first light emitting element. The second subpixel area 820 may provide a viewing angle of the first mode through the first lens 510 disposed on the third light emitting element.

In this example, the first mode may correspond to a mode in which a content is commonly provided to the driver and the passenger of the vehicle. In the first mode, the same content may be displayed to the driver and the passenger. Therefore, the driver and the passenger can view the content displayed through the display apparatus at the same time. According to an example embodiment, the first mode can be referred to as a sharing mode or a share mode, but is not limited thereto.

In the example embodiment, the first pixel circuit including a second light emitting element and the second pixel circuit including a fourth light emitting element may be provided with a common light emission signal EM0 and a second light emission signal EM2 from the gate driver 830. For example, as illustrated in FIG. 8, the first pixel circuit including a second light emitting element and the second pixel circuit including a fourth light emitting element may receive the common light emission signal EM0 from the gate driver 830 through the third line 803 and may receive the second light emission signal EM2 from the gate driver 830 through the fourth line 804 in response to driving of the second mode to allow the second and fourth light emitting elements to emit light. The first subpixel area 810 may provide a viewing angle of the first mode through the first lens 510 disposed on the second light emitting element. The second subpixel area 820 may provide a viewing angle of the second mode through the second lenses 520 disposed on the fourth light emitting element.

Here, the first subpixel area 810 in which the second light emitting element is disposed may provide light at a viewing angle of the first mode through the first lens 510 as the second light emitting element is driven even though the light emission signal (e.g., the common light emission signal EM0 and the second light emission signal EM2) of the second mode is provided. The second subpixel area 820 in which the fourth light emitting element is disposed may provide light at a viewing angle of the second mode through the second lenses 520 as the fourth light emitting element is driven in response to the light emission signal (e.g., the common light emission signal EM0 and the second light emission signal EM2) of the second mode.

In other words, since the first lens 510 is disposed on the second light emitting element and the second lenses 520 are disposed on the fourth light emitting element, the viewing angle of the second subpixel area 820 in which the fourth light emitting element is disposed can be narrower than the viewing angle of the first subpixel area 810. In this case, even though the light emission signal of the second mode is commonly provided to the first and second subpixel areas 810 and 820, the first subpixel area 810 can provide light (or content provided from the second light emitting element) to both the driver and the passenger through the first lens 510. That is, the first subpixel area 810 can operate in the first mode for providing light at the viewing angle of the first mode. However, the second subpixel area 820 can provide light (or content) provided from the fourth light emitting element to the passenger through the second lenses 520 but with a smaller viewing angle so as not to be provided to the driver. That is, in response to the driving of the second mode, the first subpixel area 810 can provide light at the viewing angle of the first mode, and the second subpixel area 820 can provide light at the viewing angle of the second mode.

The first subpixel area 810 can provide light at the viewing angle of the first mode through a first lens 510 as the first light emitting element is driven when the light emission signal of the first mode is supplied and through another first lens 510 as the second light emitting element is driven when the light emission signal of the second mode is supplied. Therefore, the first and second light emitting elements of the first subpixel area 810 may be alternately driven, so that degradation of the light emitting elements can be reduced and the lifespan of the display apparatus can be extended.

In this case, the second mode may correspond to a mode in which a driver and a passenger of a vehicle are distinguished from each other with respect to the respective contents provided to them. In the second mode, different contents can be displayed to the driver and the passenger, respectively. Alternatively, in the second mode, the display of at least some of the contents can be limited for the driver, and those contents may be displayed only to the passenger. In the second mode, contents that can be viewed by the driver through the display apparatus may be distinguished from the contents that can be viewed by the passenger through the display apparatus. That is, the contents of only the first subpixel area 810 may be viewed by the driver, and the contents of both the first subpixel area 810 and the second subpixel area 820 may be viewed by the passenger. According to the example embodiment, the second mode may be referred to as a protective mode, an individual mode, or a privacy mode, but is not limited thereto.

According to an example embodiment of the present disclosure, the display apparatus (or display panel) may display essential contents related to driving in the first subpixel area 810 in response to driving of the second mode and may limit contents (e.g., entertainment content that can disturb driving) of the second subpixel area 820 to the driver, thereby improving driving concentration of the driver for safer driving. In addition, the display apparatus may allow the passenger to view the contents displayed on the second subpixel area 820 so that the passenger can freely use the display apparatus, thereby improving usability of the display apparatus.

FIG. 8 illustrates an example in which the first lens 510 is disposed above the second lens 520 in the second subpixel area 820, but the present disclosure is not limited thereto. Another example arrangement of the first lens 510 and the second lens 520 with respect to the second subpixel area 820 will be described with reference to FIG. 9.

In this example embodiment, the first line 801 and the third line 803 may be lines that are configured to provide the same signal. In this case, the first line 801 and the third line 803 may be connected to each other, but are not limited thereto. For example, they may be formed as separate lines.

FIG. 9 illustrates a first subpixel area 810 disposed along the line A-A' in the first area (e.g., the first area 710 in FIG. 7) of FIG. 7, a second subpixel area 820 disposed along the line A-A' in the second area (e.g., the second area 720 in FIG. 7) of FIG. 7\, and a gate driving circuit 830 (e.g., at least a portion of the gate driving circuit 710 in FIG. 7) for providing a gate signal to the first subpixel area 810 and the second subpixel area 820. The description of FIG. 9 that is redundant with the description of FIG. 8 may be omitted.

As illustrated in FIG. 9, the second lenses 520 of the second subpixel area 820 may be disposed above the first lens 510.

In an example embodiment, the second lenses 520 may be disposed on the third light emitting element of the second pixel circuit disposed in the second subpixel area 820, and the first lens 510 may be disposed on the fourth light emitting element of the second pixel circuit.

The first pixel circuit including a first light emitting element in the first subpixel area 810 and the second pixel circuit including a third light emitting element in the second subpixel area 820 may receive the common light emission signal EM0 and the second light emission signal EM2 from the gate driver 830. For example, the first pixel circuit including a first light emitting element and the second pixel circuit including a third light emitting element may receive the common light emission signal EM0 and the second light emission signal EM2 from the gate driver 830 through the first and second lines 801 and 802, respectively, in response to driving of the second mode.

The first pixel circuit including a second light emitting element in the first subpixel area 810 and the second pixel circuit including a fourth light emitting element in the second subpixel area 820 may receive the common light emission signal EM0 and the first light emission signal EM1 from the gate driver 830. For example, the first pixel circuit including a first light emitting element and the second pixel circuit including a fourth light emitting element may receive the common light emission signal EM0 and the first light emission signal EM1 from the gate driver 830 through the third and fourth lines 803 and 804, respectively, in response to driving of the first mode.

The first mode may correspond to a mode in which a content is commonly provided to the driver and the passenger of the vehicle, as described above. The second mode may correspond to a mode in which the driver and the passenger of the vehicle are distinguished from each other with respect to the contents provided them on the display apparatus.

In another example embodiment, the first lens 510 may be disposed on the third light emitting element, and the second lenses 520 may be disposed on the fourth light emitting element. In this case, the third light emitting element may be disposed above the fourth light emitting element.

In FIGS. 8 and 9, one first lens 510 is disposed on one light emitting element, and two second lenses 520 are disposed on one light emitting element, but the present disclosure is not limited thereto. A plurality of first lenses 510 may be disposed on one light emitting element, or three or more second lenses 520 may be disposed on one light emitting element. This will be described in more detail with reference to FIG. 10.

FIG. 10 is a view illustrating an example arrangement of a lens and a pixel area, which are included in a display apparatus according to an example embodiment of the present disclosure. In FIG. 10, the X-axis can correspond to a pixel row, and the Y-axis can correspond to a pixel column. In FIG. 10, two associated pixel areas PA1 and PA2 arranged in different columns of one pixel row are shown as an example, but the present disclosure is not limited thereto. Three or more associated pixel areas may be disposed in one pixel row.

As illustrated in FIG. 10, a plurality of associated pixel areas may be disposed in one pixel row. For example, a first pixel area PA1 and a second pixel area PA2 may be disposed in an (n)th pixel row. A plurality of subpixels SP1, SP2 and SP3 configured to emit light of their respective colors, for example, a blue subpixel, a green subpixel, and a red subpixel, may be disposed in each of the first pixel area PA1 and the second pixel area PA2.

In the example embodiment, the first pixel area PA1 may be included in the first area 710 (see FIG. 7), and the second pixel area PA2 may be included in the second area 720 (see FIG. 7). The first pixel area PA1 may correspond to an area disposed to be adjacent to a driver's seat of a vehicle. The second pixel area PA2 may correspond to an area disposed to be adjacent to a passenger seat of the vehicle.

In the example embodiment, each pixel area (e.g., the pixel area PA in FIG. 1) includes at least three subpixels. Pixel areas make a plurality of rows and a plurality of columns. Subpixels configured to emit light of the same color, among subpixels disposed in different columns of the same row, may be connected to the same signal line (e.g., a gate line) connected to the gate driving circuit 101. For example, the first subpixel SP1 of the first pixel area PA1 may be connected to the first subpixel SP1 of the second pixel area PA2. The second subpixel SP2 of the first pixel area PA1 may be connected to the second subpixel SP2 of the second pixel area PA2. The third subpixel SP3 of the first pixel area PA1 may be connected to the third subpixel SP3 of the second pixel area PA2.

In an example embodiment, the pixel area may include a subpixel area corresponding to each of the plurality of subpixels. The subpixel area may include a lens area corresponding to each of the light emitting elements included in the subpixel. The lens area may include a light emitting element and a lens disposed on the light emitting element.

In an example embodiment, one lens area may include a plurality of lenses. That is, the plurality of lenses may be disposed on one light emitting element. as shown in FIG. 10, the third subpixel SP3 of the first pixel area PA1 may include a first lens area 511 and a second lens area 512. One first lens 510 may be disposed in the first lens area 511 included in the third subpixel SP3 of the first pixel area PA1, and two first lenses 510 may be disposed in the second lens area 512. The first lenses 510 disposed in the second lens area 512 may have different sizes from each other but are not limited thereto. The third subpixel SP3 of the second pixel area PA2 may include a first lens area 511 and a second lens area 512. One first lens 510 may be disposed in the first lens area 511 included in the third subpixel SP3 of the second pixel area PA2, and six second lenses 520 may be disposed in the second lens area 512.

The subpixels emitting light of the same color, for example, the third subpixel SP3 of the first pixel area PA1 and the third subpixel SP3 of the second pixel area PA2 may be connected to the same gate line. For example, the first pixel circuit including a first light emitting element (e.g., for the first lens area 511 in the third subpixel SP3 of the first pixel area PA1) and the second pixel circuit including a third light emitting element (e.g., for the first lens area 511 in the third subpixel SP3 of the second pixel area PA2) may be connected to the first line 801 and the second line 802 of the gate driver 101 where the third subpixel SP3 of the first pixel area PA1 includes the first light emitting element and a second light emitting element, and the third subpixel SP3 of the second pixel area PA2 includes a third light emitting element and a fourth light emitting element. The first line 801 and the second line 802 can supply the common light emission signal EM0 and the first light emission signal EM1, respectively. The first pixel circuit including the second light emitting element (e.g., for the second lens area 512 in the third subpixel SP3 of the first pixel area PA1) and the second pixel circuit including a fourth light emitting element (e.g., for the second lens area 512 in the third subpixel SP3 of the second pixel area PA2) may be connected to the third line 803 and the fourth line 804 of the gate driver 101. The third line 803 and the fourth line 804 can supply the common light emission signal EM0 and the second light emission signal EM2, respectively. Here, a planar area of each of the first to the fourth light emitting elements may substantially coincide or overlap with a planar area of a corresponding lens or lenses, or with a corresponding lens area (e.g., a first lens area 511 or a second lens area 512).

In the example embodiment, a position of the light emitting element on which the first lens 510 is disposed and a position of the light emitting element on which the second lens 520 is disposed may be designated in advance in the second subpixel area PA2. For example, in the first subpixel SP1 of the second pixel area PA2, the first lens 510 and the light emitting element on which the first lens 510 is disposed may be disposed below (in the Y-direction) the second lens 520 and the light emitting element on which the second lens 520 is disposed. In the third subpixel SP3 of the second pixel area PA2, the first lens 510 and the light emitting element on which the first lens 510 is disposed may be disposed above (in the Y-direction) the second lens 520 and the light emitting element on which the second lens 520 is disposed.

In the example embodiment, the number and size of lenses disposed in the subpixels SP1, SP2 and SP3 may be determined by at least one of a shape or an area of the subpixels SP1, SP2 and SP3. For example, where sizes of the lens areas corresponding to the respective light emitting elements in which the first lens 510 is disposed are different from each other in the third subpixel SP3 of the first pixel area PA1, the number of the first lenses may be different correspondingly, or the respective sizes of the first lenses may be different correspondingly. However, the area and size of the lens do not limit the function of the lens, that is, the control of the viewing angle.

Figure 11:
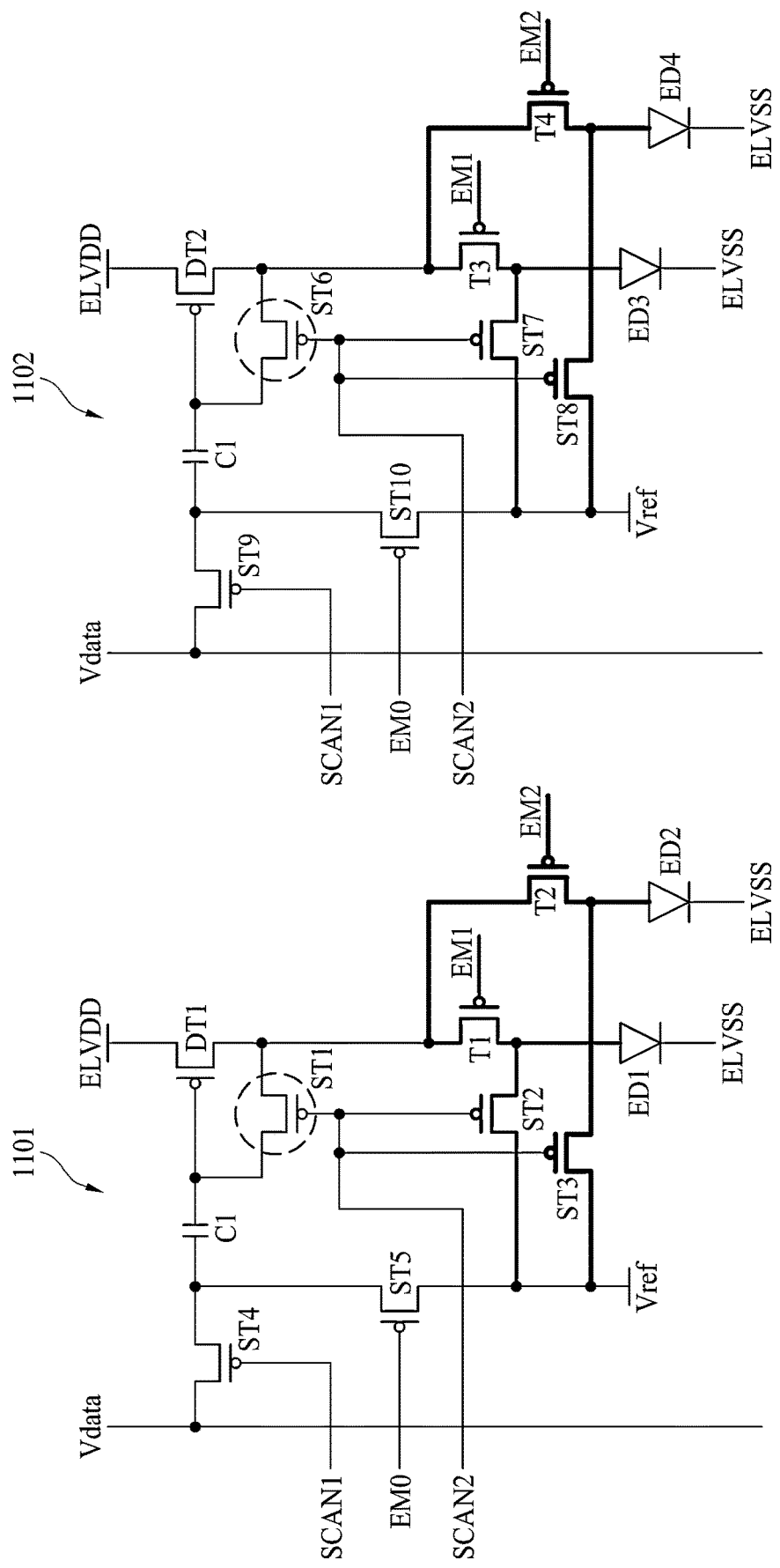
FIG. 11 is a view illustrating an example of a pixel circuit of a display apparatus according to an example embodiment of the present disclosure.

FIG. 11 is a view illustrating an example of a pixel circuit of a display apparatus according to an example embodiment of the present disclosure. In detail, FIG. 11 illustrates an example of a first pixel circuit 1101 included in a first area capable of operating in a first mode and a second pixel circuit 1102 included in a second area capable of operating in a first mode or a second mode.

As shown in FIG. 11, structures of the first pixel circuit 1101 and the second pixel circuit 1102 may correspond to each other. Components included in the first pixel circuit 1101 may be the same as those included in the second pixel circuit 1102. Hereinafter, the first pixel circuit 1101 and the second pixel circuit 1102 of FIG. 11 will be described in correspondence with FIG. 8.

In the example embodiment, the first pixel circuit 1101 may include a first driving transistor DT1, a first transistor T1 configured to receive a first light emission signal EM1 from the gate driving circuit (e.g., through the second line EM1 in FIG. 8), a second transistor T2 configured to receive a second light emission signal EM2 from the gate driving circuit (e.g., through the fourth line EM2 in FIG. 8), a first light emitting element ED1 connected to the first transistor T1, and a second light emitting element ED2 connected to the second transistor T2. The first transistor T1 and the second transistor T2 may be represented by a first emission control transistor T1 and a second emission control transistor T2, respectively.

In the example embodiment, a first electrode of the first driving transistor DT1 may be connected to a high potential power line to receive a high potential voltage ELVDD from a power supply unit (e.g., the power supply unit PU in FIG. 1). A second electrode of the first driving transistor DT1 may be connected to the first transistor T1 configured to receive the first light emission signal EM1 from the gate driving circuit and may be connected to the second transistor T2 configured to receive the second light emission signal EM2.

In the example embodiment, the second electrode of the first driving transistor DT1 may also be connected to a first scan transistor ST1. A gate electrode of the first driving transistor DT1 may be connected to a first capacitor C1.

In the example embodiment, the first capacitor C1 may include a storage capacitor for maintaining a constant voltage for one frame. The first capacitor C1 may be connected between the first driving transistor DT1 and a fourth scan transistor ST4 to uniformly maintain a data voltage Vdata supplied through the fourth scan transistor ST4 for one frame. The first capacitor C1 can uniformly maintain a gate-source voltage Vgs of the first driving transistor DT1 for one frame.

According to the example embodiment, the first capacitor C1 can maintain a constant voltage for two or more frames. In this case, the first capacitor C1 can uniformly maintain the gate-source voltage Vgs of the first driving transistor DT1 for two or more frames.

In the example embodiment, a first electrode of the first scan transistor ST1 may be connected to the gate electrode of the first driving transistor DT1. The second electrode of the first scan transistor ST1 may be connected to the second electrode of the first driving transistor DT1. A gate electrode of the first scan transistor ST1 may be connected to a second scan line that provides a second scan signal SCAN2. The first scan transistor ST1 can receive the second scan signal SCAN2 from the gate driving circuit through the second scan line.

The gate electrode of the first scan transistor ST1 may also be connected to a gate electrode of each of a second scan transistor ST2 and a third scan transistor ST3. The gate electrode of each of the second scan transistor ST2 and the third scan transistor ST3 may also be connected to the second scan line that provides the second scan signal SCAN2. In this case, the first scan transistor ST1, the second scan transistor ST2, and the third scan transistor ST3 can be turned on or off by the second scan signal SCAN2.

In the example embodiment, a first electrode of the second scan transistor ST2 may be connected to the first transistor T1 and the first light emitting element ED1. For example, the first electrode of the second scan transistor ST2 may be connected to a second electrode of the first transistor T1 and an anode electrode of the first light emitting element ED1. A second electrode of the second scan transistor ST2 may be provided with a reference voltage Vref from a reference voltage supply unit (e.g., in the power supply unit PU in FIG. 1) through a reference voltage supply line.

In the example embodiment, a first electrode of the third scan transistor ST3 may be connected to the second transistor T2 and the second light emitting element ED2. For example, the first electrode of the third scan transistor ST3 may be connected to a second electrode of the second transistor T2 and an anode electrode of the second light emitting element ED2. A second electrode of the third scan transistor ST3 may be provided with the reference voltage Vref from the reference voltage supply unit through the reference voltage supply line.

In the example embodiment, a fourth scan transistor ST4 may be connected to the first capacitor C1, a fifth scan transistor ST5, and a data voltage supply line. A first electrode of the fourth scan transistor ST4 may be connected to the first capacitor C1 and/or the fifth scan transistor ST5. A second electrode of the fourth scan transistor ST4 may be connected to the data voltage supply line to receive a data voltage Vdata. A gate electrode of the fourth scan transistor ST4 can receive a first scan signal SCAN1 from the gate driving circuit through a first scan line. The fourth scan transistor ST4 can be turned on/off by the first scan signal SCAN1. When the fourth scan transistor ST4 is turned on, a data voltage Vdata can be provided to the first capacitor C1.

In the example embodiment, a first electrode of the fifth scan transistor ST5 may be connected to the fourth scan transistor ST4 and/or the first capacitor C1. A second electrode of the fifth scan transistor ST5 may be provided with the reference voltage Vref from the reference voltage supply unit through the reference voltage supply line.

In the example embodiment, the first pixel circuit 1101 may further include a transistor for receiving a common light emission signal. For example, the first pixel circuit 1101 may further include a fifth scan transistor ST5 configured to receive a common light emission signal EM0. A gate electrode of the fifth scan transistor ST5 may be supplied with a common light emission signal EM0 from the gate driving circuit through a common light emission signal line (e.g., the first line 801 in FIG. 8). The fifth scan transistor ST5 can be turned on or off by the common light emission signal EM0.

In the example embodiment, the first transistor T1 may be connected between the first driving transistor DT1 and the first light emitting element ED1. A gate electrode of the first transistor T1 may be connected to a first light emission signal line (e.g., the second line 802 of FIG. 8) to receive a first light emission signal EM1. The first transistor T1 can be turned on or off by the first light emission signal EM1. For example, the first transistor T1 can be turned on in response to the supply of the first light emission signal EM1. In this case, the first light emitting element ED1 and the first driving transistor DT1 may be electrically connected to each other.

In the example embodiment, the second transistor T2 may be connected between the first driving transistor DT1 and the second light emitting element ED2. A gate electrode of the second transistor T2 may be connected to a second light emission signal line (e.g., the fourth line 804 of FIG. 8) to receive a second light emission signal EM2. The second transistor T2 can be turned on or off by the second light emission signal EM2. For example, the second transistor T2 can be turned on in response to the supply of the second light emission signal EM2. In this case, the second light emitting element ED2 and the first driving transistor DT1 may be electrically connected to each other.

In the example embodiment, a cathode electrode of the first light emitting element ED1 can receive a low potential voltage ELVSS from the power supply unit through a low potential voltage supply line. The first light emitting element ED1 may be electrically connected to the first driving transistor DT1 in response to the first transistor T1 being turned on. In this case, the first light emitting element ED1 can receive a voltage from the first driving transistor DT1 to emit light.

In the example embodiment, a cathode electrode of the second light emitting element ED2 can receive the low potential voltage ELVSS from the power supply unit through the low potential voltage supply line. The second light emitting element ED2 may be connected to the first driving transistor DT1 in response to the second transistor T2 being turned on. In this case, the second light emitting element ED2 can receive a voltage from the first driving transistor DT1 to emit light.

In the example embodiment, the second pixel circuit 1102 may include a second driving transistor DT2, a third transistor T3 configured to receive the first light emission signal EM1 from the gate driving circuit, a fourth transistor T4 configured to receive the second light emission signal EM2 from the gate driving circuit, a third light emitting element ED3 connected to the third transistor T3, and a fourth light emitting element ED4 connected to the fourth transistor T4. The third transistor T3 and the fourth transistor T4 may be represented by a third emission control transistor T3 and a second emission control transistor T4, respectively.

In the example embodiment, a first electrode of the second driving transistor DT2 may be connected to a high potential power line to receive a high potential voltage ELVDD from the power supply unit (e.g., the power supply unit PU in FIG. 1). A second electrode of the second driving transistor DT2 may be connected to the third transistor T3 configured to receive the first light emission signal EM1 from the gate driving circuit and may be connected to the fourth transistor T4 configured to receive the second light emission signal EM2.

In the example embodiment, the second electrode of the second driving transistor DT2 may be connected to the sixth scan transistor ST6. The gate electrode of the second driving transistor DT2 may be connected to a second capacitor C2

In an example embodiment, the second capacitor C2 may include a storage capacitor for maintaining a constant voltage for one frame. The second capacitor C2 may be connected between the second driving transistor DT2 and a ninth scan transistor ST9 to uniformly maintain the data voltage Vdata supplied through the ninth scan transistor ST9 for one frame. The second capacitor C2 can uniformly maintain the gate-source voltage Vgs of the second driving transistor DT2 for one frame.

In the example embodiment, the data voltage Vdata supplied to the ninth scan transistor ST9 may correspond to the data voltage Vdata supplied to the fourth scan transistor ST4 of the first pixel circuit 1101. Although not shown, at least a portion of a data line for supplying the data voltage Vdata to the ninth scan transistor ST9 and a portion of a data line for supplying the data voltage Vdata to the fourth scan transistor ST4 may be connected to each other.

In the example embodiment, a first electrode of a sixth scan transistor ST6 may be connected to a gate electrode of the second driving transistor DT2. A second electrode of the sixth scan transistor ST6 may be connected to a second electrode of the second driving transistor DT2. A gate electrode of the sixth scan transistor ST6 may be connected to a second scan line that provides the second scan signal SCAN2. The sixth scan transistor ST6 can receive the second scan signal SCAN2 from the gate driving circuit through the second scan line.

The gate electrode of the sixth scan transistor ST6 may also be connected to a gate electrode of each of a seventh scan transistor ST7 and an eighth scan transistor ST8. The gate electrode of each of the seventh scan transistor ST7 and the eighth scan transistor ST8 may be connected to the second scan line that provides the second scan signal SCAN2. In this case, the sixth scan transistor ST6, the seventh scan transistor ST7, and the eighth scan transistor ST8 can be turned on or off by the second scan signal SCAN2.

In the example embodiment, a first electrode of the seventh scan transistor ST7 may be connected to the third transistor T3 and the third light emitting element ED3. For example, the first electrode of the seventh scan transistor ST7 may be connected to a second electrode of the third transistor T3 and an anode electrode of the third light emitting element ED3. A second electrode of the seventh scan transistor ST7 may be provided with the reference voltage Vref from the reference voltage supply unit through the reference voltage supply line.

In the example embodiment, a first electrode of the eighth scan transistor ST8 may be connected to the fourth transistor T4 and the fourth light emitting element ED4. For example, the first electrode of the eighth scan transistor ST8 may be connected to a second electrode of the fourth transistor T4 and an anode electrode of the fourth light emitting element ED4. A second electrode of the eighth scan transistor ST8 may be provided with the reference voltage Vref from the reference voltage supply unit through the reference voltage supply line.

In the example embodiment, the ninth scan transistor ST9 may be connected to the second capacitor C2, a tenth scan transistor ST10, and the data voltage supply line for supplying the data voltage Vdata. A first electrode of the ninth scan transistor ST9 may be connected to the second capacitor C2 and/or the tenth scan transistor ST10. A second electrode of the ninth scan transistor ST9 may be connected to the data voltage supply line to receive the data voltage Vdata. A gate electrode of the ninth scan transistor ST9 can receive the first scan signal SCAN1 from the gate driving circuit through the first scan line. The ninth scan transistor ST9 can be turned on/off by the first scan signal SCAN1.

When the ninth scan transistor ST9 is turned on, the data voltage Vdata can be provided to the second capacitor C2.

In the example embodiment, a first electrode of the tenth scan transistor ST10 may be connected to the ninth scan transistor ST9 and/or the second capacitor C2. A second electrode of the tenth scan transistor ST10 may be provided with the reference voltage Vref from the reference voltage supply unit through the reference voltage supply line.

In the example embodiment, the second pixel circuit 1102 may further include a transistor for receiving a common light emission signal. For example, the second pixel circuit 1102 may further include a tenth scan transistor ST10 configured to receive a common light emission signal EM0. A gate electrode of the tenth scan transistor ST10 can be supplied with the common light emission signal EM0 through the common light emission signal line (e.g., the first line 801 or the third line 803 in FIG. 8) from the gate driving circuit. The tenth scan transistor ST10 can be turned on or off by the common light emission signal EM0.

In the example embodiment, the third transistor T3 may be connected between the second driving transistor DT2 and the third light emitting element ED3. A gate electrode of the third transistor T3 may be connected to the first light emission signal line (e.g., the second line 802 of FIG. 8) to receive the first light emission signal EM1. The third transistor T3 can be turned on or off by the first light emission signal EM1. For example, the third transistor T3 can be turned on in response to the supply of the first light emission signal EM1. In this case, the third light emitting element ED3 and the second driving transistor DT2 can be electrically connected to each other.

In the example embodiment, the fourth transistor T4 may be connected between the second driving transistor DT2 and the fourth light emitting element ED4. A gate electrode of the fourth transistor T4 may be connected to the second light emission signal line (e.g., the fourth line 804 of FIG. 8) to receive the second light emission signal EM2. The fourth transistor T4 can be turned on or off by the second light emission signal EM2. For example, the fourth transistor T4 can be turned on in response to the supply of the second light emission signal EM2. In this case, the fourth light emitting element ED4 and the second driving transistor DT2 can be electrically connected to each other.

In the embodiment, a cathode electrode of the third light emitting element ED3 can receive the low potential voltage ELVSS from the power supply unit through the low potential voltage supply line. The third light emitting element ED3 can be electrically connected to the third driving transistor DT3 in response to the third transistor T3 being turned on. In this case, the third light emitting element ED3 can receive a voltage from the third driving transistor DT3 to emit light.

In the example embodiment, a cathode electrode of the fourth light emitting element ED4 can receive the low potential voltage ELVSS from the power supply unit through the low potential voltage supply line. The fourth light emitting element ED4 can be electrically connected to the second driving transistor DT2 in response to the fourth transistor T4 being turned on. In this case, the fourth light emitting element ED4 can receive a voltage from the second driving transistor DT2 to emit light.

According to another example embodiment, the third transistor T3 connected to the third light emitting element ED3 of the second pixel circuit 1102 may be connected to a line for providing the second light emission signal EM2, and the fourth transistor T4 connected to the fourth light emitting element ED4 may be connected to a line for providing the first light emission signal EM1. That is, the transistors T3 and T4 connected respectively to the third and fourth light emitting elements ED3 and ED4 can be alternatively connected to the light emission signals EM2 and EM1, unlike in the example illustrated in FIG. 11. In this case, the example embodiment of FIG. 9 may be implemented, but this is only an example and does not limit the example embodiment of FIG. 9.

In the example embodiment, at least some of the transistors (e.g., the first driving transistor DT1, the first scan transistor ST1 to the tenth scan transistor ST10, the first transistor T1, and the second transistor T2) included in the first pixel circuit 1101 and the second pixel circuit 1102 may be an n-type transistor or a p-type transistor. In case of the p-type transistor, a low-level voltage of each driving signal provided to a respective gate electrode may mean a voltage for turning on the transistors, and a high-level voltage of each such driving signal may mean a voltage for turning off the transistors.

In this case, the low-level voltage may correspond to a predesignated voltage lower than the high-level voltage. For example, the low-level voltage may include a voltage in a range of −8V to −12V. The high-level voltage may correspond to a predesignated voltage higher than the low-level voltage. For example, the high-level voltage may include a voltage in a range of 6V to 8V. According to an example embodiment, the low-level voltage may be referred to as a first voltage, and the high-level voltage may be referred to as a second voltage. In this case, the first voltage may be a value lower than the second voltage.

In the example embodiment, the first light emission signal EM1 and the second light emission signal EM2 may be provided to at least one of the first pixel circuit 1101 and the second pixel circuit 1102 in accordance with an input related to a mode control of at least one of the first area and the second area. For example, the first light emission signal EM1 may be provided to the first pixel circuit 1101 and the second pixel circuit 1102 in response to an input that causes an operation of the first mode or satisfying a first condition (predesignated condition). The second light emission signal EM2 may be provided to the first pixel circuit 1101 and the second pixel circuit 1102 in response to an input that causes an operation of the second mode or satisfying a second condition (predesignated condition distinguished from the first condition). In response to the first light emission signal EM1 or the second light emission signal EM2, the first light emitting element ED1 and the third light emitting element ED3 may emit light, or the second light emitting element ED2 and the fourth light emitting element ED4 may emit light.

In the example embodiment, the first light emitting element ED1, the second light emitting element ED2, the third light emitting element ED3, and/or the fourth light emitting element ED4 may be an organic light emitting element, an inorganic light emitting element, or a quantum dot light emitting element, but the present disclosure is not limited thereto. Where the light emitting element (e.g., the first light emitting element ED1, the second light emitting element ED2, the third light emitting element ED3, or the fourth light emitting element ED4) is an organic light emitting element, a light emitting layer of the light emitting element may include an organic light emitting layer containing an organic material.

In the example embodiment, at least one lens may be disposed on each of the first light emitting element ED1, the second light emitting element ED2, the third light emitting element ED3, and the fourth light emitting element ED4. In an example embodiment, at least three first lenses may be disposed on the first light emitting element ED1, the second light emitting element ED2, and the third light emitting element ED3, collectively. At least one second lens may be disposed on the fourth light emitting element ED4. For example, a first lens may be disposed on each of the first light emitting element ED1, the second light emitting element ED2, and the third light emitting element ED3. As shown in FIG. 8, two second lenses may be disposed on the fourth light emitting element ED4.

In an example embodiment, a planar shape of the first lens may correspond to a rectangle extended in one direction. A planar shape of the second lens may correspond to a circle. A cross-section of each of the first lens and the second lens may correspond to a semi-oval or semicircular shape. A planar size of each of the second lenses may be greater than a corresponding light emitting area of the fourth light emitting element ED4. For example, a second lens may be disposed to cover the corresponding light emitting area of the fourth light emitting element ED4.

The first lens may include a lens for controlling a propagating direction of light in a first direction and a second direction. The second lens may include a lens for controlling the propagating direction of the light in the first direction.

A viewing angle of an area corresponding to the light emitting element (e.g., the first light emitting element ED1, the second light emitting element ED2 and the third light emitting element ED3) in which the first lens is disposed may have a first value. A viewing angle of an area corresponding to the light emitting element (e.g., the fourth light emitting element ED4) in which the second lens is disposed may have a second value (smaller than the first value).

In the example embodiment, the gate driving circuit (e.g., the gate driver GD in FIG. 1) can provide the first light emission signal EM1 in response to driving in the first mode and can provide the second light emission signal EM2 in response to driving in the second mode. When the display apparatus is driven in the first mode, the first light emission signal EM1 can be provided. When the display apparatus is driven in the second mode, the second light emission signal EM2 can be provided.

In this case, since the first lenses are disposed in the first area (e.g., the first pixel area PA1 in FIG. 10) in which the first pixel circuit 1101 is disposed, the first area can maintain the first mode regardless of the driving of the display apparatus in the first mode or the second mode. That is, the first area can have a viewing angle of a first value regardless of the driving of the display apparatus in the first mode or the second mode. The second area can have a viewing angle corresponding to the first value in response to the driving in the first mode and can have a viewing angle corresponding to the second value in response to the driving in the second mode. The second area can be driven in the first mode in response to the driving in the first mode and can be driven in the second mode in response to the driving in the second mode. In this case, since the viewing angle in the second mode becomes narrower than that in the first mode, no content can be viewed by a user in the driver's seat (that is, the driver) positioned to be farther than a predetermined distance from the second area. On the other hand, the content can be viewed by a user positioned in a passenger seat (that is, a front passenger) positioned to be closer than a predetermined distance from the second area.

Figure 12:
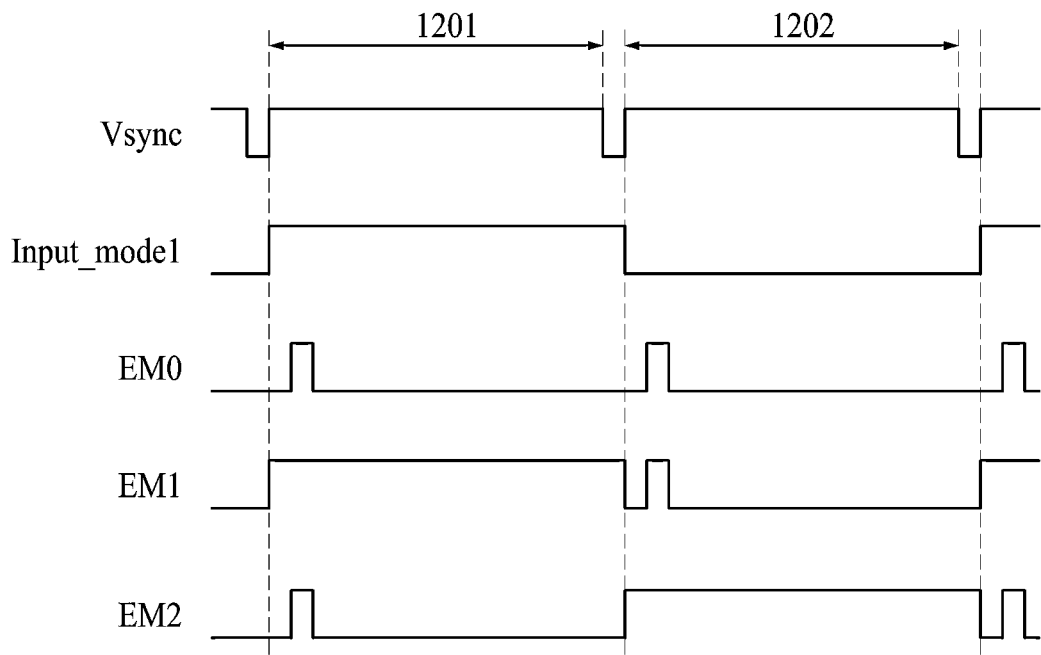
FIG. 12 is a view illustrating an example of a signal flow in a display apparatus according to an example embodiment of the present disclosure.

FIG. 12 is a view illustrating an example of a signal flow of a display apparatus according to an example embodiment of the present disclosure. FIG. 12 is an example view illustrating a flow of signals provided to the first pixel circuit 1101 and the second pixel circuit 1102 of the display apparatus according to the example embodiment of FIG. 11.

As shown in FIG. 12, a timing controller (e.g., the timing controller TC in FIG. 1) can generate a gate control signal for controlling a gate driver based on a vertical synchronization signal Vsync having a predetermined period. As shown, the vertical synchronization signal Vsync may include an active period (e.g., a first active period 1201 and a second active period 1202) in each frame and a non-active period between the active periods 1201 and 1202.

The timing controller can control the gate driver (e.g., the gate driver GD in FIG. 1) by generating a mode control signal Input_mode1 and a gate control signal based on the vertical synchronization signal Vsync. The gate driver can generate a common light emission signal EM0, a first light emission signal EM1, and a second emission control EM2 based on the mode control signal Input_mode1 and the gate control signal to supply the generated first light emission signal EM0, the first light emission signal EM1, and the second emission signal EM2 to the pixel circuits disposed in the display panel.

In the example embodiment, the gate driver can receive, from the timing controller, the mode control signal Input_mode1 in a second mode state at the first active period 1201 and can receive the mode control signal Input_mode1 in a first mode state at the second active period 1202. The mode control signal Input_mode1 may be applied in the first or second mode state based on, for example, whether a first condition (e.g., the vehicle is stopped) is satisfied or on an input applied from a user.

In the example embodiment, the gate driver can generate the common light emission signal EM0 regardless of the level of the mode control signal Input_mode1 and may provide the generated common light emission signal EM0 to the pixel circuits (e.g., the first pixel circuit and the second pixel circuit) disposed on the display panel. For example, the common light emission signal EM0 can be generated at each of the active periods 1201 and 1202 of each frame and be applied to the pixel circuit. A timing point when the common light emission signal EM0 is applied can be designated in advance.

In the example embodiment, the gate driver can generate a first light emission signal EM1 in an off-state and a second light emission signal EM2 in an on state in response to the second mode state of the mode control signal Input_mode1 to supply the generated first and second light emission signals EM1 and EM2 to the pixel circuits. For example, during the first active period 1201 at which the mode control signal input_mode1 is applied in the second mode state, the first light emission signal EM1 may be applied in an off state, and the second light emission signal EM2 may be applied in an on state. For example, the first light emission signal EM1 may be applied in an off state during the first active period 1201. The second light emission signal EM2 may be applied in an on state during most of the first active period 1201 and may be applied in an off state only during a partial period synchronized with the common light emission signal EM0.

In the example embodiment, the gate driver can generate a first light emission signal EM1 of an on state and a second light emission signal EM2 of an off-state in response to the first mode state of the mode control signal Input_mode1 to supply the on-state first light emission signal EM1 and the off-state second light emission signal EM2 to the pixel circuits. For example, during the second active period 1202 at which the mode control signal input_mode1 is applied in the first mode state, the first light emission signal EM1 may be applied in an on state, and the second light emission signal EM2 may be applied in an off state. For example, the second light emission signal EM2 may be applied in an off state during the second active period 1202. The first light emission signal EM1 may be applied in an on state during most of the second active period 1202 and may be applied in an off state only during a partial period synchronized with the common light emission signal EM0.

Figure 13:
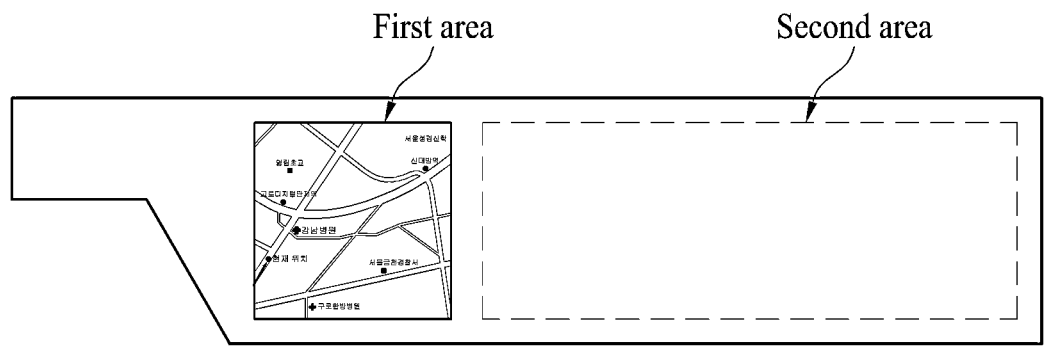
FIGS. 13 to 15 are views illustrating examples of screens displayed in accordance with different modes in a display apparatus according to an example embodiment of the present disclosure.
Figure 14:
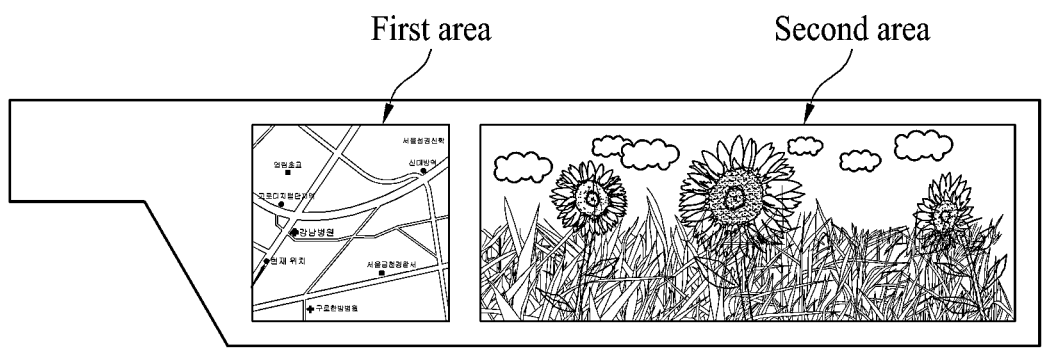
Figure 15:
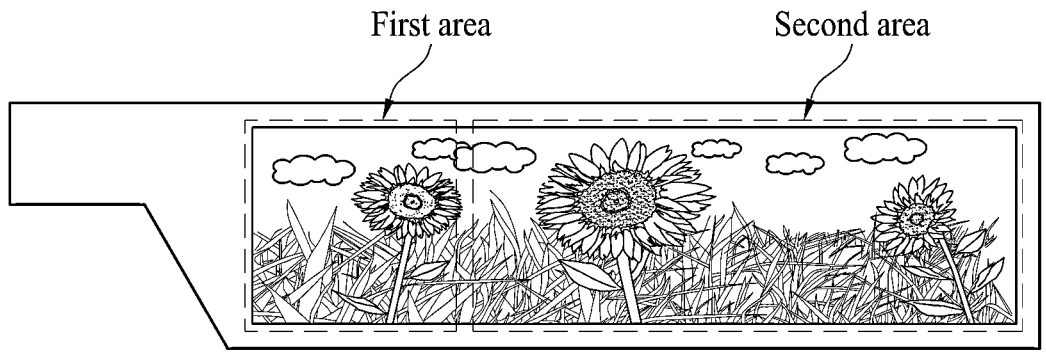

FIGS. 13 to 15 are views illustrating examples of screens displayed in accordance with different modes in a display apparatus according to example embodiments of the present disclosure.

FIG. 13 illustrates an example of a display apparatus viewed from a driver's seat in response to the operation of the display apparatus in the second mode. In the example embodiment, when the display apparatus operates in the second mode, the first area in which a first pixel circuit (e.g., the first pixel circuit 1101 of FIG. 11) is disposed can have a viewing angle of a first value, and the second area in which a second pixel circuit (e.g., the second pixel circuit 1102 of FIG. 11) is disposed can have a viewing angle of a second value (a predesignated value less than the first value). In this case, as shown, the content displayed in the first area can be recognized from the driver's seat. However, the content displayed in the second area cannot be recognized from the driver's seat due to the limitation of the viewing angle.

FIG. 14 illustrates an example display apparatus viewed from a passenger seat in the same situation as that of FIG. 13. The viewing angle of the first value is a value set to be greater than the second value so that the content can be recognized from a wider range of directions, and the content displayed in the first area can be recognized from the passenger seat (and even from the driver's seat). The viewing angle of the second value is set to be smaller than the first value so that the content can be recognized from the passenger seat disposed closer to the second area. Thus, the content displayed in the second area can be recognized from the passenger seat but cannot be recognized from the driver's seat.

In the example embodiment, FIG. 14 may represent a display apparatus viewed from a driver's seat and a passenger seat when operating in a first mode. The first mode allows the first area and the second area to be recognized in the vicinity of the display apparatus as well as from the driver's seat and the passenger seat. Therefore, as shown in FIG. 14, the contents of the first area and the second area can be recognized from each of the driver's seat and the passenger seat. That is, in the first mode, the same content can be recognized in the driver's seat and the passenger seat.

FIG. 15 illustrates an example content that is displayed across the first area and the second area. In detail, FIG. 15 illustrates an example content displayed in a wider display area including the first area and the second area in the first mode. Since the same content can be recognized from each of the driver's seat and the passenger seat in the first mode, the example content can be recognized in the form shown in FIG. 15 in each of the driver's seat and the passenger seat.

According to the example embodiment of FIG. 15, in which one content is shared and displayed across the first and second areas, the shared content in the first mode may be maintained and then be required to be switched to the second mode. In this case, a predesignated content (different from the shared content) may be displayed in the first area, and the shared content can be displayed only in the second area. The content that is predesignated to be displayed in the first area can include a content, for example, navigation information, weather information, or driving information, that does not disturb driving. As another example, the predesignated may can include a content corresponding to an empty screen (e.g., a black screen) such that no content is displayed.

The display apparatus and the display panel included in the display apparatus according to various example embodiments of the present disclosure may be described as follows.

A display apparatus according to an example embodiment of the present disclosure may comprise: a gate driving circuit configured to output a first light emission signal and a second light emission signal; a first pixel circuit including a first light emitting element configured to emit light based on the first light emission signal and a second light emitting element configured to emit light based on the second light emission signal; a second pixel circuit including a third light emitting element configured to emit light based on one of the first and second light emission signals and a fourth light emitting element configured to emit light based on the other of the first and second light emission signals; a first lens disposed on each of the first light emitting element, the second light emitting element, and one of the third and fourth light emitting elements, the one of the third and fourth light emitting elements being configured to emit light based on the first light emission signal; and at least one second lens different from the first lens and disposed on the other of the third and fourth light emitting elements, the other of the third and fourth light emitting elements being configured to emit light based on the second light emission signal.

In some example embodiments, the first pixel circuit may further include: a first driving transistor configured to drive the first light emitting element and the second light emitting element to emit light; a first transistor connected between the first driving transistor and the first light emitting element and configured to turn on or off based on the first light emission signal; and a second transistor connected between the first driving transistor and the second light emitting element and configured to turn on or off based on the second light emission signal.

In some example embodiments, the second pixel circuit may further include: a second driving transistor configured to drive the third light emitting element and the fourth light emitting element to emit light; a third transistor connected between the second driving transistor and the third light emitting element and configured to turn on or off based on the one of the third and fourth light emission signals; and a fourth transistor connected between the second driving transistor and the fourth light emitting element and configured to turn on or off based on the other of the third and fourth light emission signals.

In some example embodiments, the first lens may have a planar shape of a rectangle extended in one direction, the at least one second lens may have a planar shape of a circle, and a cross-section of each of the first lens and the at least one second lens may have a semi-oval shape or a semicircular shape.

In some example embodiments, the at least one second lens may overlap with and have a larger planar area than a light emitting area of the other of the third and fourth light emitting elements.

In some example embodiments, the first lens may be configured to control a propagation direction of light in a first direction and a second direction, and the at least second lens may be configured to control a propagation direction of light in the first direction.

In some example embodiments, the gate driving circuit may be configured to provide the first light emission signal in a first mode and to provide the second light emission signal in a second mode, the first pixel circuit may be disposed in a first display area of the display apparatus and be configured to operate in the first mode, and the second pixel circuit may be disposed in a second display area of the display apparatus and be configured to operate in the first mode or the second mode.

In some example embodiments, at least one of the first display area and the second display area operating in the first mode may have a greater viewing angle than the second display area operating in the second mode.

In some example embodiments, the first display area may be smaller than the second display area.

In some example embodiments, the display apparatus may be disposed in a vehicle, the first display area may be disposed closer to a driver's seat of the vehicle than to a front passenger seat of the vehicle, and the second area may be disposed closer to the front passenger seat than the first display area is.

In some example embodiments, the first light emitting element, the second light emitting element, the third light emitting element, and the fourth light emitting element may be configured to emit light of a first color.

In some example embodiments, the first light emitting element and the second light emitting element may be configured to emit light of a first color, and the third light emitting element and the fourth light emitting element may be configured to emit light of a second color different from the first color.

In some example embodiments, the gate driving circuit may be further configured to output a common light emission signal, and each of the first pixel circuit and the second pixel circuit further may include a transistor configured to receive the common light emission signal.

In another example embodiment of the present disclosure, a display panel may comprise: a first display area and a second display area adjacent to each other; a first pixel circuit disposed in the first display area and including a first light emitting element configured to emit light based on a first light emission signal from a gate driving circuit and a second light emitting element configured to emit light based on a second light emission signal from the gate driving circuit; a second pixel circuit disposed in the second display area and including a third light emitting element configured to emit light based on one of the first and second light emission signals and a fourth light emitting element configured to emit light based on the other of the first and second light emission signals; a first lens disposed on the first light emitting element, the second light emitting element, and one of the third and fourth light emitting elements, the one of the third and fourth light emitting elements being configured to emit light based on the first light emission signal; and at least one second lens different from the first lens and disposed on the other of the third and fourth light emitting elements, the other of the third and fourth light emitting elements being configured to emit light based on the second light emission signal.

In some example embodiments, the first pixel circuit may further include: a first driving transistor configured to drive the first light emitting element and the second light emitting element to emit light; a first transistor connected between the first driving transistor and the first light emitting element and configured to turn on or off based on the first light emission signal; and a second transistor connected between the first driving transistor and the second light emitting element and configured to turn on or off based on the second light emission signal.

In some example embodiments, the second pixel circuit may further include: a second driving transistor configured to drive the third light emitting element and the fourth light emitting element to emit light; a third transistor connected between the second driving transistor and the third light emitting element and configured to turn on or off based on the one of the third and fourth light emission signals; and a fourth transistor connected between the second driving transistor and the fourth light emitting element and configured to turn on or off based on the other of the third and fourth light emission signals.

In some example embodiments, the first lens may have a planar shape of a rectangle extended in one direction, the at least one second lens may have a planar shape of a circle, and a cross-section of each of the first lens and the at least one second lens may have a semi-oval shape or a semicircular shape.

In some example embodiments, the first lens may be configured to control a propagation direction of light in a first direction and a second direction, and the at least second lens may be configured to control a propagation direction of light in the first direction.

In some example embodiments, the first light emission signal may be configured to be provided from the gate driving circuit in a first mode, the second light emission signal may be configured to be provided by the gate driving circuit in a second mode, the first pixel circuit may be configured to operate in the first mode, and the second pixel circuit may be configured to in the first mode or the second mode.

In some example embodiments, at least one of the first display area and the second display area operating in the first mode may have a greater viewing angle than the second display area operating in the second mode.

In some example embodiments, the display panel may be disposed in a vehicle, the first area may be disposed closer to a driver's seat of the vehicle than a front passenger seat of the vehicle, and the second area may be disposed closer to the front passenger seat than the first display area is.

In some example embodiments, each of the first pixel circuit and the second pixel circuit may further include a transistor configured to receive a common light emission signal from the gate driving circuit.

According to example embodiments of the present disclosure, the following advantageous effects may be obtained.

In the pixel circuit and the display apparatus according to example embodiments of the present disclosure, the viewing angle of at least a portion of the display apparatus can be adjusted in accordance with the applicable mode based on implementation of the plurality of light emitting elements and the lenses disposed on the plurality of light emitting elements in each pixel area. Therefore, the pixel circuit and the display apparatus can provide a content suitable for a user's situation or selection.

It will be apparent to those skilled in the art that the present disclosure is not limited by the above-described example embodiments and the accompanying drawings and that various substitutions, modifications, and variations can be made in the present disclosure without departing from the spirit or scope of the disclosures. Thus, it is intended that the present disclosure covers all modifications and variations of this disclosure that come within the scope of the appended claims and their equivalents.

What is claimed is:

1. A display apparatus, comprising:
a gate driving circuit configured to output a first light emission signal and a second light emission signal;
a first pixel circuit in a first display area of the display apparatus, the first pixel circuit including:
a first light emitting element configured to emit light based on the first light emission signal; and
a second light emitting element configured to emit light based on the second light emission signal;
a second pixel circuit in a second display area of the display apparatus, the second pixel circuit including:
a third light emitting element configured to emit light based on one of the first and second light emission signals; and
a fourth light emitting element configured to emit light based on the other of the first and second light emission signals;
a plurality of first lenses disposed on the first light emitting element and the second light emitting element in the first display area and disposed on one of the third and fourth light emitting elements in the second display area; and
at least one second lens disposed on the other of the third and fourth light emitting elements in the second display area,
wherein the first pixel circuit is configured to operate the first and second light emitting elements in a same mode,
wherein the second pixel circuit is configured to operate the third and fourth light emitting elements in different modes from each other,
wherein the first pixel circuit is configured to operate in a first mode with the first light emitting element emitting light and to operate in the first mode with the second light emitting element emitting light,
wherein the second pixel circuit is configured to operate in the first mode with the one of the third and fourth light emitting elements emitting light and to operate in a second mode with the other of the third and fourth light emitting elements emitting light, the second mode being different from the first mode,
wherein the first mode is a share mode using the plurality of first lenses, and
wherein the second mode is a privacy mode using the at least one second lens, the second display area having a narrower viewing angle in the privacy mode than in the share mode.

2. The display apparatus of claim 1, wherein the first pixel circuit further includes:
a first driving transistor configured to drive the first light emitting element and the second light emitting element to emit light;
a first transistor connected between the first driving transistor and the first light emitting element and configured to turn on or off based on the first light emission signal; and
a second transistor connected between the first driving transistor and the second light emitting element and configured to turn on or off based on the second light emission signal.

3. The display apparatus of claim 2, wherein the second pixel circuit further includes:
a second driving transistor configured to drive the third light emitting element and the fourth light emitting element to emit light;
a third transistor connected between the second driving transistor and the third light emitting element and configured to turn on or off based on the one of the third and fourth light emission signals; and
a fourth transistor connected between the second driving transistor and the fourth light emitting element and configured to turn on or off based on the other of the third and fourth light emission signals.

4. The display apparatus of claim 1, wherein:
the plurality of first lenses have a planar shape of a rectangle extended in one direction, and the at least one second lens has a planar shape of a circle, and
a cross-section of each of the plurality of first lenses and the at least one second lens has a semi-oval shape or a semicircular shape.

5. The display apparatus of claim 1, wherein the at least one second lens overlaps with and has a larger planar area than a light emitting area of the other of the third and fourth light emitting elements.

6. The display apparatus of claim 1, wherein:
the plurality of first lenses are configured to control a propagation direction of light in a first direction and a second direction, and
the at least one second lens is configured to control a propagation direction of light in the first direction.

7. The display apparatus of claim 1, wherein:
the gate driving circuit is configured to provide the first light emission signal to operate both the first display area and the second display area in the first mode and to provide the second light emission signal to operate the first display area in the first mode and the second display area in the second mode.

8. The display apparatus of claim 7, wherein at least one of the first display area and the second display area operating in the first mode has a greater viewing angle than the second display area operating in the second mode.

9. The display apparatus of claim 7, wherein the first display area is smaller than the second display area.

10. The display apparatus of claim 9, wherein:
the display apparatus is disposed in a vehicle,
the first display area is disposed closer to a driver's seat of the vehicle than to a front passenger seat of the vehicle, and
the second display area is disposed closer to the front passenger seat than the first display area is.

11. The display apparatus of claim 1, wherein the first light emitting element, the second light emitting element, the third light emitting element, and the fourth light emitting element are configured to emit light of a first color.

12. The display apparatus of claim 1, wherein:
the first light emitting element and the second light emitting element are configured to emit light of a first color, and
the third light emitting element and the fourth light emitting element are configured to emit light of a second color different from the first color.

13. The display apparatus of claim 1, wherein:
the gate driving circuit is further configured to output a common light emission signal, and
each of the first pixel circuit and the second pixel circuit further includes a transistor configured to receive the common light emission signal.

14. A display panel, comprising:
a first display area and a second display area adjacent to each other;
a first pixel circuit disposed in the first display area and including:

a first light emitting element configured to emit light based on a first light emission signal from a gate driving circuit; and a second light emitting element configured to emit light based on a second light emission signal from the gate driving circuit;

a second pixel circuit disposed in the second display area and including:

a third light emitting element configured to emit light based on one of the first and second light emission signals; and a fourth light emitting element configured to emit light based on the other of the first and second light emission signals;

a plurality of first lenses disposed on the first light emitting element and the second light emitting element in the first display area and disposed on one of the third and fourth light emitting elements in the second display area; and at least one second lens disposed on the other of the third and fourth light emitting elements in the second display area, wherein the first pixel circuit is configured to operate the first and second light emitting elements in a same mode, wherein the second pixel circuit is configured to operate the third and fourth light emitting elements in different modes from each other, wherein the first display area is configured to operate in a first mode with the first light emitting element emitting light and to operate in the first mode with the second light emitting element emitting light, wherein the second display area is configured to operate in the first mode with the one of the third and fourth light emitting elements emitting light and to operate in a second mode with the other of the third and fourth light emitting elements emitting light, the second mode being different from the first mode, wherein the first mode is a share mode using the plurality of first lenses, and wherein the second mode is a privacy mode using the at least one second lens, the second display area having a narrower viewing angle in the privacy mode than in the share mode.

15. The display panel of claim 14, wherein the first pixel circuit further includes:

a first driving transistor configured to drive the first light emitting element and the second light emitting element to emit light;

a first transistor connected between the first driving transistor and the first light emitting element and configured to turn on or off based on the first light emission signal; and a second transistor connected between the first driving transistor and the second light emitting element and configured to turn on or off based on the second light emission signal.

16. The display panel of claim 15, wherein the second pixel circuit further includes:

a second driving transistor configured to drive the third light emitting element and the fourth light emitting element to emit light;

a third transistor connected between the second driving transistor and the third light emitting element and configured to turn on or off based on the one of the third and fourth light emission signals; and a fourth transistor connected between the second driving transistor and the fourth light emitting element and configured to turn on or off based on the other of the third and fourth light emission signals.

17. The display panel of claim 14, wherein:

the plurality of first lenses have a planar shape of a rectangle extended in one direction, and the at least one second lens has a planar shape of a circle, and a cross-section of each of the plurality of first lenses and the at least one second lens has a semi-oval shape or a semicircular shape.

18. The display panel of claim 14, wherein:

the plurality of first lenses are configured to control a propagation direction of light in a first direction and a second direction, and the at least second lens is configured to control a propagation direction of light in the first direction.

19. The display panel of claim 14, wherein:

the first light emission signal is configured to be provided from the gate driving circuit to operate both the first pixel circuit and second pixel circuit in the first mode, and the second light emission signal is configured to be provided by the gate driving circuit to operate the first pixel circuit in the first mode and the second pixel circuit in the second mode.

20. The display panel of claim 19, wherein at least one of the first display area and the second display area operating in the first mode has a greater viewing angle than the second display area operating in the second mode.

21. The display panel of claim 14, wherein:

the display panel is disposed in a vehicle, the first display area is disposed closer to a driver's seat of the vehicle than a front passenger seat of the vehicle, and the second display area is disposed closer to the front passenger seat than the first display area is.

22. The display panel of claim 14, wherein each of the first pixel circuit and the second pixel circuit further includes a transistor configured to receive a common light emission signal from the gate driving circuit.

\* \* \* \* \*